(12) United States Patent
Matsuzawa et al.

(10) Patent No.: US 11,189,544 B2
(45) Date of Patent: Nov. 30, 2021

(54) PLURALITY OF COOLING TUBES WITH COOLANT FOR A POWER CONVERSION PACKAGE

(71) Applicant: DENSO CORPORATION, Kariya (JP)

(72) Inventors: Hiroki Matsuzawa, Kariya (JP); Bahman Hossini Soltani, Kariya (JP)

(73) Assignee: DENSO CORPORATION, Kariya (JP)

( * ) Notice: Subject to any disclaimer, the term of this patent is extended or adjusted under 35 U.S.C. 154(b) by 16 days.

(21) Appl. No.: 16/782,371

(22) Filed: Feb. 5, 2020

(65) Prior Publication Data

US 2020/0176354 A1  Jun. 4, 2020

Related U.S. Application Data

(63) Continuation of application No. PCT/JP2018/028836, filed on Aug. 1, 2018.

(30) Foreign Application Priority Data

Aug. 11, 2017  (JP) .............................. JP2017-156255

(51) Int. Cl.
*H01L 23/495* (2006.01)
*H01L 23/34* (2006.01)
(Continued)

(52) U.S. Cl.
CPC .......... *H01L 23/46* (2013.01); *H01L 21/4871* (2013.01); *H01L 23/3107* (2013.01);
(Continued)

(58) Field of Classification Search
CPC ... H01L 23/473; H01L 23/3107; H01L 23/36; H01L 23/46; H01L 23/3121;
(Continued)

(56) References Cited

U.S. PATENT DOCUMENTS 7,250,674 B2 * 7/2007 Inoue .................... H01L 25/117
257/712
7,547,966 B2 * 6/2009 Funakoshi .......... H01L 23/4334
257/707
(Continued)

FOREIGN PATENT DOCUMENTS

JP  2007-236120 A  9/2007
JP  2008-124430 A  5/2008
(Continued)

OTHER PUBLICATIONS

International Search Report issued in PCT/JP2018/028836, dated Sep. 18, 2018; ISA/JP.

*Primary Examiner* — Alonzo Chambliss
(74) *Attorney, Agent, or Firm* — Harness, Dickey & Pierce, P.L.C.

(57) ABSTRACT

A power conversion apparatus includes a semiconductor element, a plurality of lead frames, a flow-passage formation body, an insulating portion, a metal joining material, and a resin sealing portion. The plurality of lead frames are electrically connected to the semiconductor element. The flow-passage formation body forms a coolant flow passage in which a coolant flows. The insulating portion is arranged between the lead frame and the flow-passage formation body to provide insulation between the lead frame and the flow-passage formation body. The metal joining material joins the insulating portion and the flow-passage formation body. The resin sealing portion seals the semiconductor element and the lead frames. The semiconductor element and the lead frames are integrated with the flow-passage formation body to form a semiconductor cooling assembly by the resin sealing portion.

18 Claims, 31 Drawing Sheets

(51) Int. Cl.

| | | |
|---|---|---|
| H01L 23/28 | (2006.01) | |
| H01L 21/00 | (2006.01) | |
| H01L 23/46 | (2006.01) | |
| H01L 23/31 | (2006.01) | |
| H01L 23/00 | (2006.01) | |
| H01L 25/07 | (2006.01) | |
| H01L 25/11 | (2006.01) | |
| H01L 25/00 | (2006.01) | |
| H01L 23/473 | (2006.01) | |
| H01L 21/48 | (2006.01) | |
| H01L 23/373 | (2006.01) | |
| H01L 23/36 | (2006.01) | |

(52) U.S. Cl.
CPC ........ *H01L 23/3121* (2013.01); *H01L 23/36* (2013.01); *H01L 23/3735* (2013.01); *H01L 23/473* (2013.01); *H01L 23/49537* (2013.01); *H01L 23/49568* (2013.01); *H01L 23/49575* (2013.01); *H01L 24/32* (2013.01); *H01L 24/33* (2013.01); *H01L 25/072* (2013.01); *H01L 25/117* (2013.01); *H01L 25/50* (2013.01); *H01L 2224/32245* (2013.01); *H01L 2224/33181* (2013.01)

(58) Field of Classification Search
CPC ......... H01L 23/49537; H01L 23/49568; H01L 23/49575; H01L 24/32; H01L 24/33; H01L 25/072; H01L 25/117; H01L 25/50; H01L 2924/181; H01L 21/4871; H01L 23/3735
See application file for complete search history.

(56) References Cited

U.S. PATENT DOCUMENTS

| | | | | |
|---|---|---|---|---|
| 8,450,845 | B2* | 5/2013 | Ikeda | H01L 23/49537 257/712 |
| 10,253,729 | B2* | 4/2019 | Oono | F01P 3/18 |
| 2003/0090873 | A1* | 5/2003 | Ohkouchi | H01L 25/115 361/704 |
| 2004/0144996 | A1* | 7/2004 | Inoue | H01L 23/4006 257/200 |
| 2005/0040515 | A1* | 2/2005 | Inoue | H01L 24/40 257/706 |
| 2006/0120047 | A1* | 6/2006 | Inoue | H01L 25/117 361/699 |
| 2006/0232939 | A1* | 10/2006 | Inoue | H01L 24/40 361/704 |
| 2007/0216013 | A1* | 9/2007 | Funakoshi | H01L 24/33 257/691 |
| 2008/0224303 | A1 | 9/2008 | Funakoshi et al. | |
| 2011/0037166 | A1* | 2/2011 | Ikeda | H01L 24/37 257/712 |
| 2011/0318884 | A1* | 12/2011 | Noritake | H01L 23/4334 438/122 |
| 2012/0256194 | A1 | 10/2012 | Yoshihara et al. | |
| 2013/0267064 | A1* | 10/2013 | Ikeda | H01L 25/117 438/109 |
| 2016/0064308 | A1* | 3/2016 | Yamada | H01L 23/49811 257/697 |

FOREIGN PATENT DOCUMENTS

| | | |
|---|---|---|
| JP | 2010-16402 A | 1/2010 |
| JP | 2012-178513 A | 9/2012 |
| JP | 2013-30579 A | 2/2013 |
| JP | 2016-131197 A | 7/2016 |
| WO | WO-2010/131679 A1 | 11/2010 |

* cited by examiner

PLURALITY OF COOLING TUBES WITH COOLANT FOR A POWER CONVERSION PACKAGE

CROSS-REFERENCE TO RELATED APPLICATIONS

The present application is a continuation application of International Application No. PCT/JP2018/028836, filed Aug. 1, 2018, which claims priority to Japanese Patent Application No. 2017-156255, filed Aug. 11, 2017. The contents of these applications are incorporated herein by reference in their entirety.

BACKGROUND

Technical Field

The present disclosure relates to a power conversion apparatus.

Related Art

As a structure that effectively performs heat release from a semiconductor element that configures a power conversion apparatus, there is a structure that uses a cooling tube in which a coolant flow passage is provided. In this cooling structure, grease is interposed between the cooling tube and a semiconductor module that incorporates the semiconductor element.

SUMMARY

The present disclosure provides a power conversion apparatus that includes a semiconductor element, a plurality of lead frames, a flow-passage formation body, an insulating portion, a metal joining material, and a resin sealing portion. The plurality of lead frames are electrically connected to the semiconductor element. The flow-passage formation body forms a coolant flow passage in which a coolant flows. The insulating portion is arranged between the lead frame and the flow-passage formation body to provide insulation between the lead frame and the flow-passage formation body. The metal joining material joins the insulating portion and the flow-passage formation body. The resin sealing portion seals the semiconductor element and the lead frames. The semiconductor element and the lead frames are integrated with the flow-passage formation body to form a semiconductor cooling assembly by the resin sealing portion.

DESCRIPTION OF THE EMBODIMENTS

Figure 1:
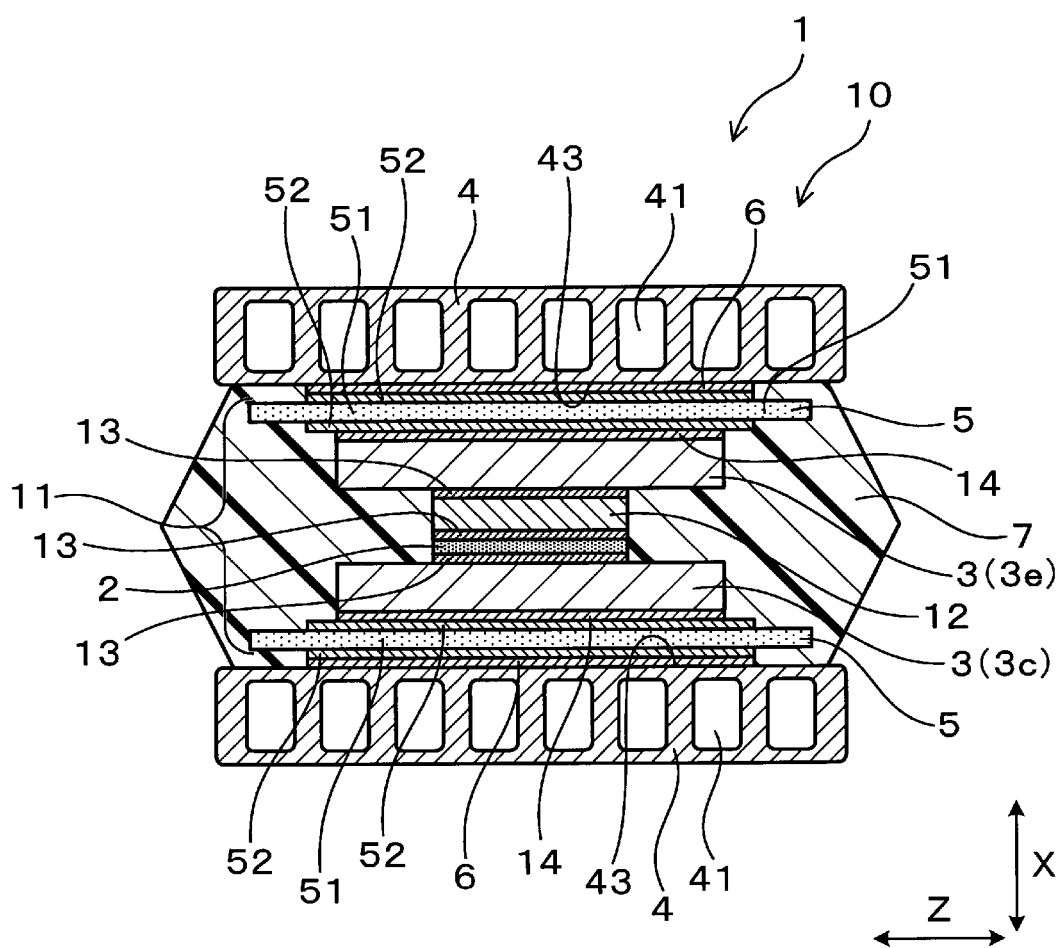
FIG. 1 is an explanatory cross-section view of a semiconductor cooling assembly according to a first embodiment.

As disclosed in JP-A-2007-236120, as a structure that effectively performs heat release from a semiconductor element that configures a power conversion apparatus, there is a structure that uses a cooling tube in which a coolant flow passage is provided. In this cooling structure, grease is interposed between the cooling tube and a semiconductor module that incorporates the semiconductor element. That is, the semiconductor module and the cooling tube, which are components that are separate from each other, are placed in contact with grease between the semiconductor module and the cooling tube. As a result, thermal resistance between the semiconductor module and the cooling tube is minimized. Cooling performance is thereby improved.

The thermal resistance of grease is significantly higher than that of metal. Therefore, in the cooling structure in which grease is interposed between the semiconductor module and the cooling tube, there is room for further improvement in cooling performance.

In addition, when grease is placed between the semiconductor module and the cooling tube, a step for applying the grease is required. Furthermore, when heat-release performance is taken into consideration, a coating thickness of the grease is also required to be managed. Therefore, an issue arises in terms of productivity as well.

It is thus desired to provide a power conversion apparatus that is capable of improving cooling performance of a semiconductor element and productivity thereof.

An exemplary embodiment of the present disclosure provides a power conversion apparatus that includes: a semiconductor element; a lead frame that is electrically connected to the semiconductor element; a flow-passage formation body that forms a coolant passage in which a coolant flows; an insulating portion that is arranged between the lead frame and the flow-passage formation body to provide insulation between the lead frame and the flow-passage formation body; a metal joining material that joins the insulating portion and the flow-passage formation body; and a resin sealing portion that seals the semiconductor element and the lead frame, in which the semiconductor element and the lead frame are integrated with the flow-passage formation body to form a semiconductor sealing assembly by the resin sealing portion.

The above-described power conversion apparatus includes the metal joining material that joins the insulating portion and the flow-passage formation body. That is, the insulating portion and the flow-passage formation body are joined by the metal joining material. Therefore, thermal resistance between the insulating portion and the flow-passage formation body can be sufficiently reduced. As a result, thermal resistance between the flow-passage formation body and the semiconductor element can be reduced. Consequently, cooling performance of the semiconductor element can be improved. In addition, because the metal joining material has high thermal conductivity, thickness control can be relatively relaxed. Consequently, productivity regarding the power conversion apparatus can be improved.

In addition, the semiconductor element and the lead frames are integrated with the flow-passage formation body to form the semiconductor cooling assembly by the resin sealing portion. That is, the semiconductor element and the like are integrated with the flow-passage formation body by the resin sealing portion that is required for electrical insulation protection of the semiconductor element. Consequently, the number of manufacturing steps can be reduced and productivity regarding the power conversion apparatus can be improved.

As described above, according to the above-described exemplary embodiment, a power conversion apparatus that is capable of improving cooling performance of a semiconductor element and productivity can be provided.

First Embodiment

A power conversion apparatus according to a first embodiment will be described with reference to FIG. 1 to FIG. 12.

As shown in FIG. 1, a power conversion apparatus 1 according to the present embodiment includes a semiconductor element 2, a plurality of lead frames 3, a cooling tube 4, an insulating portion 5, a metal joining material 6, and a resin sealing portion 7.

The lead frames 3 are electrically connected to the semiconductor element 2. The cooling tube 4 is an aspect of a flow-passage formation body that forms a coolant flow passage 41 in which a coolant flows. The insulating portion 5 is arranged between the lead frame 3 and the cooling tube 4 to provide insulation between the lead frame 3 and the cooling tube 4. The metal joining material 6 joins the insulating portion 5 and the cooling tube 4. The resin sealing portion 7 seals the semiconductor element 2 and the lead frames 3.

The semiconductor element 2 and the lead frames 3 are integrated with the cooling tubes 4 to form a semiconductor cooling assembly 10 by the resin sealing portion 7. That is, the semiconductor cooling assembly 10 includes the resin sealing portion 7, and the semiconductor element 2, the lead frames 2, the insulating portion 5, and the cooling tube 4 that are integrated by the resin sealing portion 7.

Figure 2:
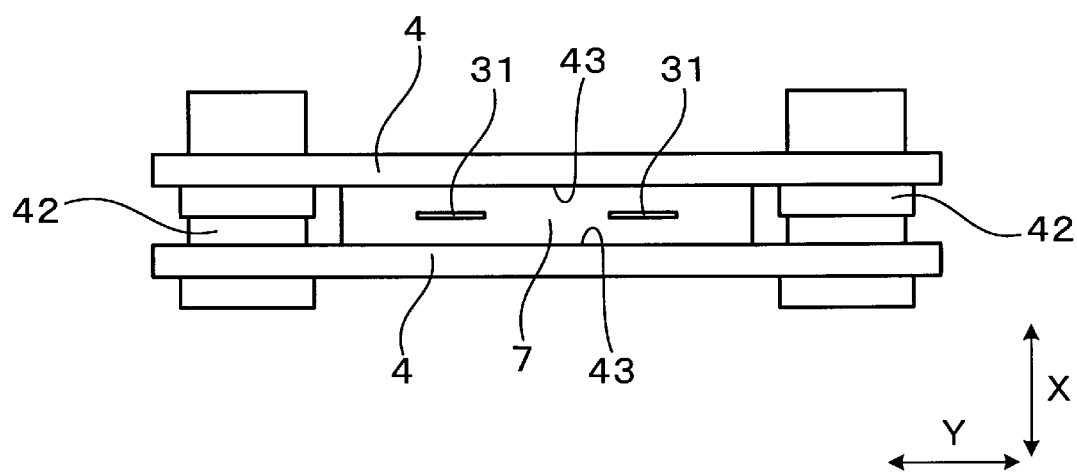
FIG. 2 is an explanatory plan view of the semiconductor cooling assembly according to the first embodiment.
Figure 3:
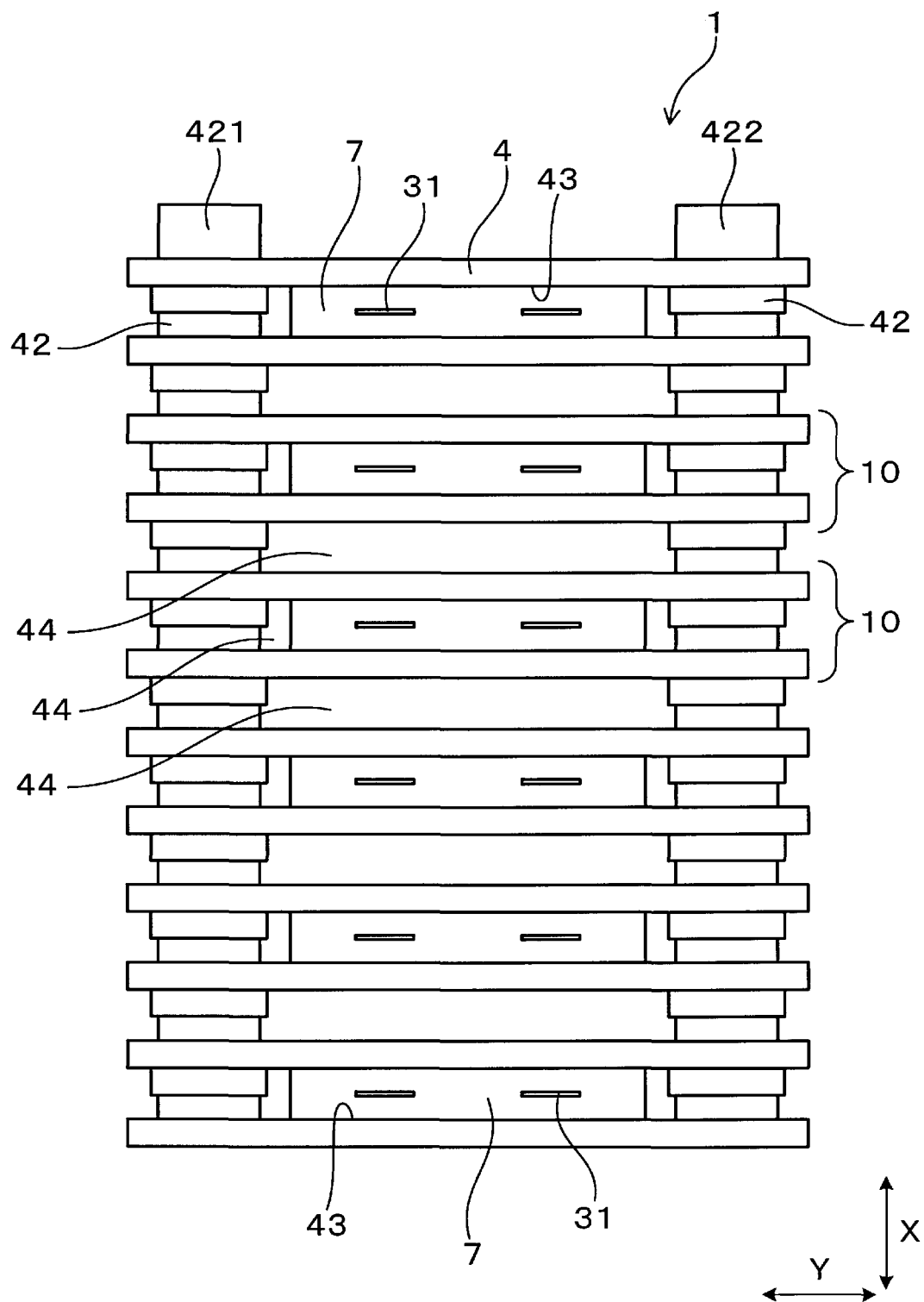
FIG. 3 is an explanatory plan view of a power conversion apparatus according to the first embodiment.

According to the present embodiment, as shown in FIG. 1 to FIG. 3, the power conversion apparatus includes a plurality of cooling tubes 4. The plurality of cooling tubes 4 are arranged to be laminated in a direction that is perpendicular to a flow direction of the coolant. As shown in FIG. 1 and FIG. 2, the semiconductor cooling assembly 10 includes a pair of cooling tubes 4 that are arranged opposite to each other in a lamination direction X. In addition, the semiconductor cooling assembly 10 includes the resin sealing portion 7, the semiconductor element 2, the lead frames 3, and the insulating portion 5 that are arranged between the pair of cooling tubes 4 and are integrated with the pair of cooling tubes 4.

For example, the cooling tube 4 is configured by a metal that has excellent thermal conductivity, such as aluminum. As shown in FIG. 2 and FIG. 3, the cooling tube 4 has a shape that is elongated in one direction that is perpendicular to the lamination direction X. In the present specification, for convenience, this direction is referred to as a lateral direction Y. In addition, for convenience, a direction that is perpendicular to both the lamination direction X and the lateral direction Y is referred to as a vertical direction Z.

As shown in FIG. 2 and FIG. 3, the cooling tubes 4 that are adjacent to each other in the lamination direction X are connected by connecting portions 42 that communicate between respective coolant flow passages 41. The connecting portions 42 are provided near both end portions of the cooling tubes 4 in the lateral direction Y. The resin sealing portion 7 is arranged between the pair of connecting portions 24 in the lateral direction Y.

Here, the above-described flow direction of the coolant refers not to a localized flow direction of the coolant, but to a flow direction of the coolant throughout the overall coolant flow passage 41 of the cooling tube 4. Therefore, according to the present embodiment, an arrangement direction of the pair of connecting portions 42 is the flow direction of the coolant. The lateral direction Y is the flow direction of the coolant.

For example, the resin sealing portion 7 is composed of resin that has excellent heat resistance and electrical insulation properties, such as thermosetting resins such as epoxy resins and phenolic resins, or super engineering plastics such as polyphenylene sulfide (PPS). The resin sealing portion 7 is integrated with the cooling tubes 4 by being placed in close contact with and bonded to opposing surfaces 43 at which the pair of cooling tubes 4 oppose each other.

The semiconductor element 2 is a switching element that configures a switching circuit in the power conversion apparatus 1. For example, as the semiconductor element 2, an insulated-gate bipolar transistor (IGBT) or a metal-oxide-semiconductor field-effect transistor (MOSFET) can be used. Hereafter, a description in which the IGBT is used as the semiconductor element 2 is given.

As shown in FIG. 1, the lead frames 3 are laminated onto both sides of the semiconductor element 2 in the lamination direction X. The two lead frames 3 are a lead frame 3c that is connected to a collector of the semiconductor element 2 and a lead frame 3e that is connected to an emitter of the semiconductor element 2. For example, these lead frames 3 are composed of copper.

The lead frame 3c is connected to the semiconductor element 2 by solder 13. In addition, a terminal chip 12 is arranged between the lead frame 3e and the semiconductor element 2. For example, the terminal chip 12 is composed of a conductor such as copper. The solder 13 joins the terminal chip 12 and the semiconductor element 2, and joins the terminal chip 12 and the lead frame 3e.

In addition, the insulating portion 5 is interposed between the lead frame 3 and the cooling tube 4. The insulating portion 5 includes a ceramic substrate 51 and metal layers 52 that are respectively formed on both main surfaces of the ceramic substrate 51. The metal layers 52 are respectively formed on both main surfaces of the ceramic substrate 51 in sections excluding peripheral edge portions. That is, an outer contour of the metal layer 52 is formed further inward than an outer contour of the ceramic substrate 51.

For example, as the insulating portion 5 such as this that is composed of a ceramic plate with metal layers, an insulating portion in which the metal layers 52 are joined to the ceramic substrate 51 by an active metal brazing method can be given. For example, as the insulating portion 5, an insulating portion configured by the metal layers 52 that are composed of aluminum being joined, using a brazing material, to both main surfaces of the ceramic substrate 51 that is composed of alumina can be used. In this case, as the brazing material that joins the metal layers 52 to the ceramic substrate 51, a metal brazing material that is active against alumina can be used. However, a manufacturing method for the insulating portion 5 is not particularly limited. In addition, a portion of the resin sealing portion 7 may be the insulating portion 5.

The lead frame 3 is joined to the metal layer 52 on one main surface of the insulating portion 5 by a brazing material 14. In addition, the metal layer 52 on the other main surface of the insulating portion 5 is joined to the cooling tube 4 by the metal joining material 6. The cooling tube 4 that is the flow-passage formation body has the coolant flow passage 41 in a position that opposes a section to which the metal joining material 6 is joined. That is, the insulating portion 5 is joined, by the metal joining material 6, to the section of the cooling tube 4 in which the coolant flow passage 41 is formed.

A brazing material is used as the metal joining material 6. However, the metal joining material 6 is not limited thereto. For example, solder or the like can be used. In addition, instead of the brazing material 14, other metal joining materials such as solder may be used to join the lead frame 3 and the insulating portion 5, as well.

In this manner, the semiconductor element 2, the pair of lead frames 3, and the pair of insulating portions 5 that are laminated between the pair of cooling tubes 4 are sealed by the resin sealing portion 7. Here, a component group that is composed of the semiconductor element 2, the pair of lead frames 3, and the pair of insulating portions 5 that are laminated between the pair of cooling tubes 4 is referred to as a laminated component group 11, hereafter, as appropriate.

Figure 12:
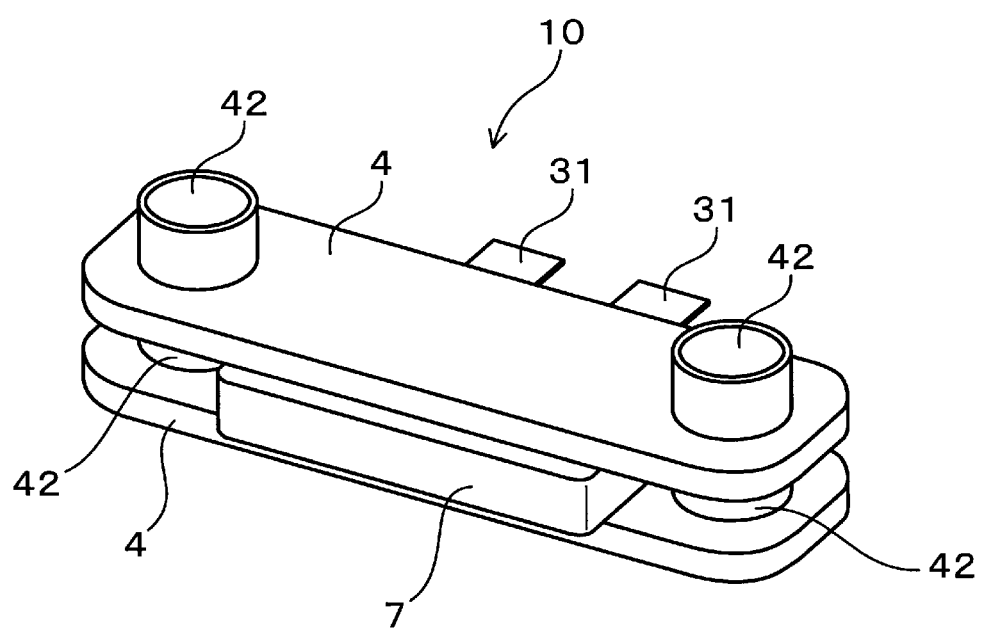
FIG. 12 is an explanatory perspective view of the semiconductor cooling assembly according to the first embodiment.

In addition, the laminated component group 11, the pair of cooling tubes 4, and the resin sealing portion 7 are integrated, thereby configuring the semiconductor cooling assembly 10. Here, as shown in FIG. 7 to FIG. 10, a power terminal 31 is provided in a portion of the lead frame 3. The power terminal 31 protrudes from the resin sealing portion 7. As shown in FIG. 2, FIG. 3, and FIG. 12, the power terminal 31 protrudes from the resin sealing portion 7 in the same direction as the vertical direction Z.

In manufacturing of the semiconductor cooling assembly 10 such as that described above, sub-assemblies 101 and 102 shown in FIG. 4 and FIG. 5 are fabricated by components being respectively laminated onto one and the other of the pair of cooling tubes 4. In addition, as shown in FIG. 6, the sub-assemblies 101 and 102 are stacked together such that the cooling tubes 4 are on the outer sides, and joined. Furthermore, as shown in FIG. 1, the resin sealing portion 7 is formed to cover the laminated component group 11 in a space between the pair of cooling tubes 4. The semiconductor cooling assembly 10 is thereby fabricated.

Figure 4:
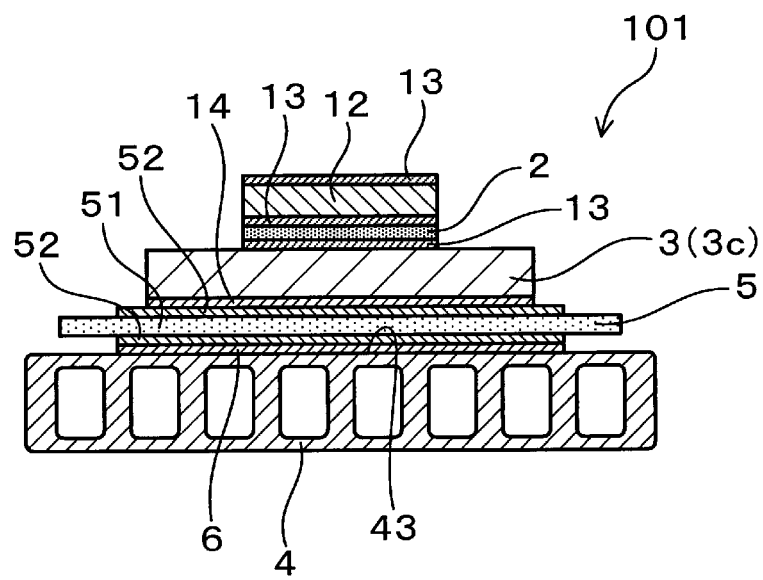
FIG. 4 is an explanatory cross-section view of a first sub-assembly according to the first embodiment.
Figure 7:
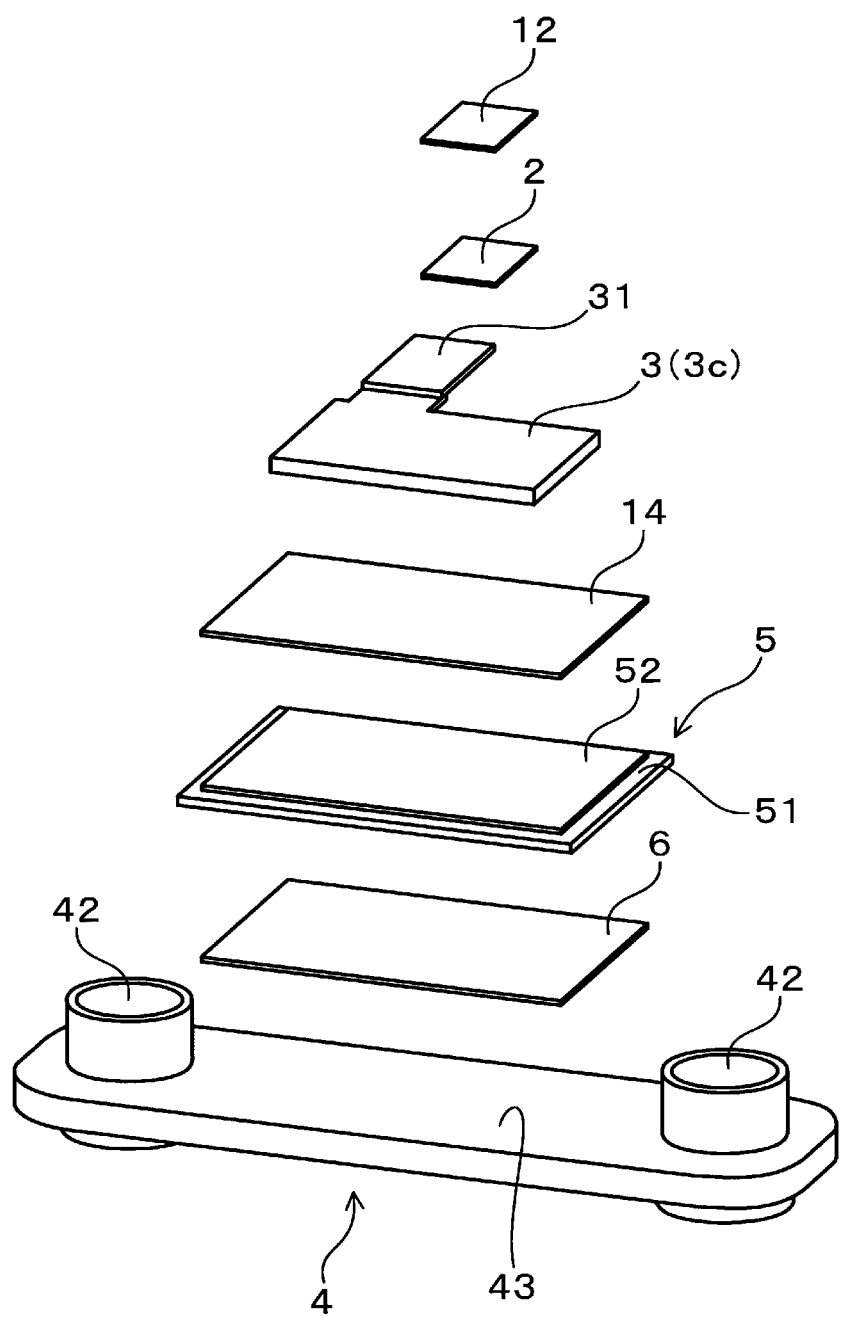
FIG. 7 is an explanatory perspective view of a manufacturing process for the first sub-assembly according to the first embodiment.
Figure 8:
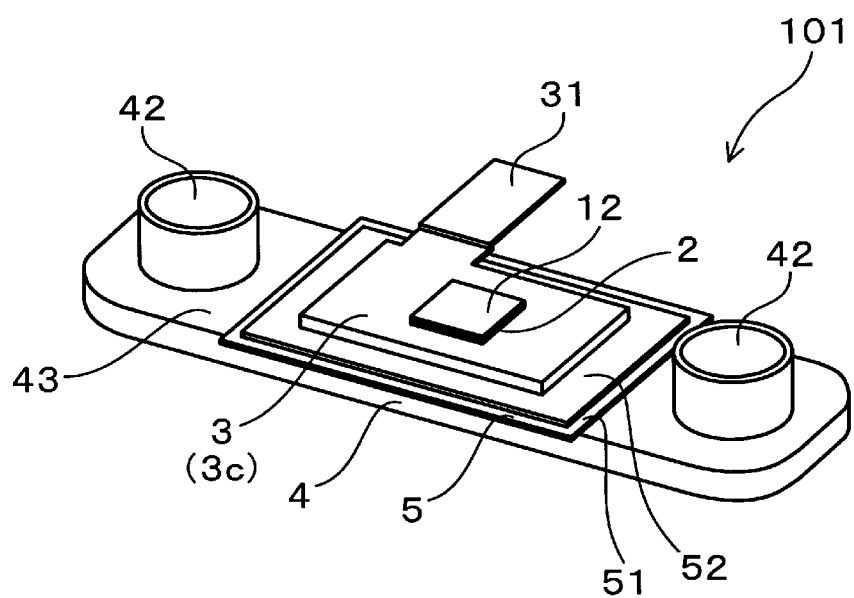
FIG. 8 is an explanatory perspective view of the manufacturing process for the first sub-assembly, following that in FIG. 7.

The first sub-assembly 101 shown in FIG. 4 is configured by the cooling tube 4, the insulating portion 5, the lead frame 3c, the semiconductor element 2, and the terminal chip 12 being laminated. Here, the terminal chip 12 is also a constituent component of the above-described laminated component group 11. In fabrication of the first sub-assembly 101, as shown in FIG. 7 and FIG. 8, the insulating portion 5 is joined to the opposing surface 43 of the cooling tube 4 by a brazing material that serves as the metal joining material 6. In addition, the lead frame 3c is joined to a surface of the insulating portion 5 on the side opposite the cooling tube 4 by the brazing material 14. Furthermore, the semiconductor element 2 is joined to a surface of the lead frame 3c on the side opposite the insulating portion 5 via the solder 13. Moreover, the terminal chip 12 is joined to a surface of the semiconductor element 2 on the side opposite the lead frame 3c via the solder 13. As a result, the sub-assembly 101 is formed. Here, the solder 13 is also formed on a surface of the terminal chip 12 on the side opposite the semiconductor element 2.

Figure 5:
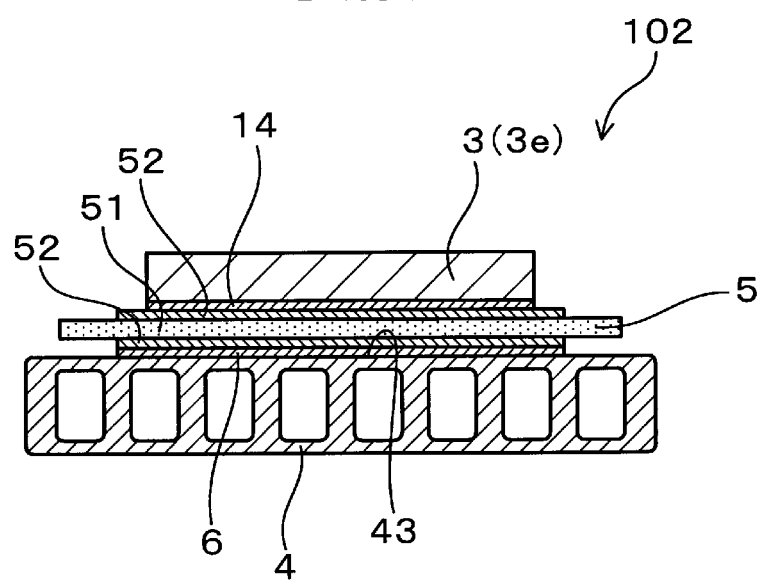
FIG. 5 is an explanatory cross-section view of a second sub-assembly according to the first embodiment.
Figure 6:
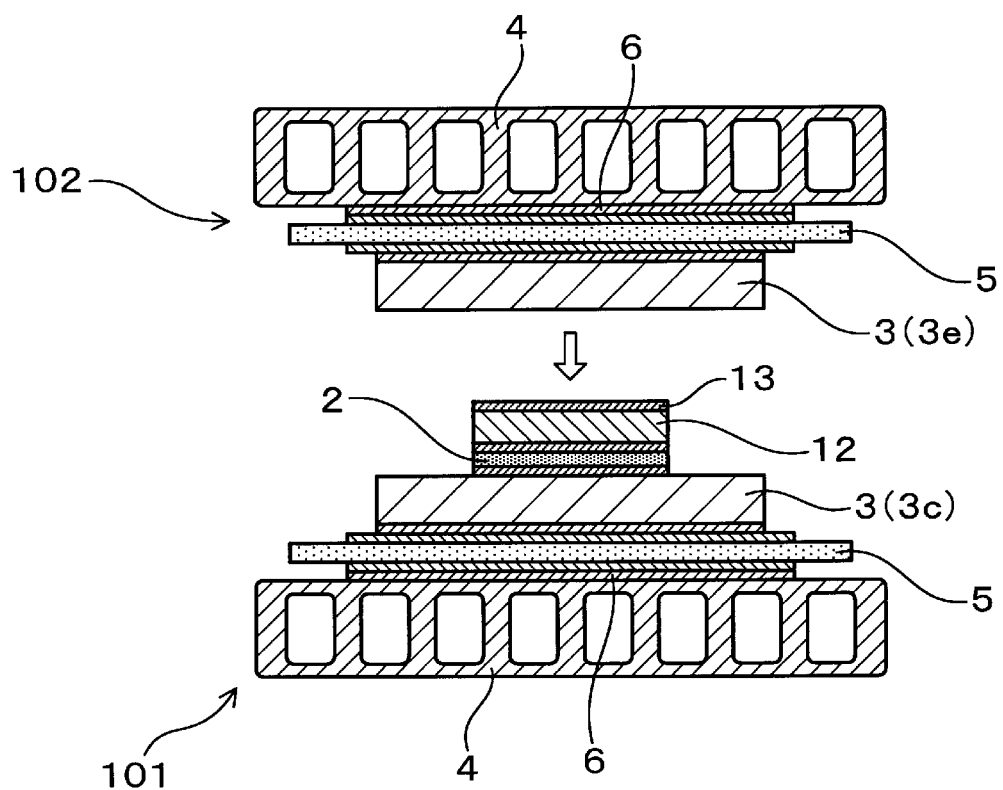
FIG. 6 is an explanatory cross-section view of a manufacturing process for the semiconductor cooling assembly according to the first embodiment, showing an aspect in which two sub-assemblies are combined.
Figure 9:
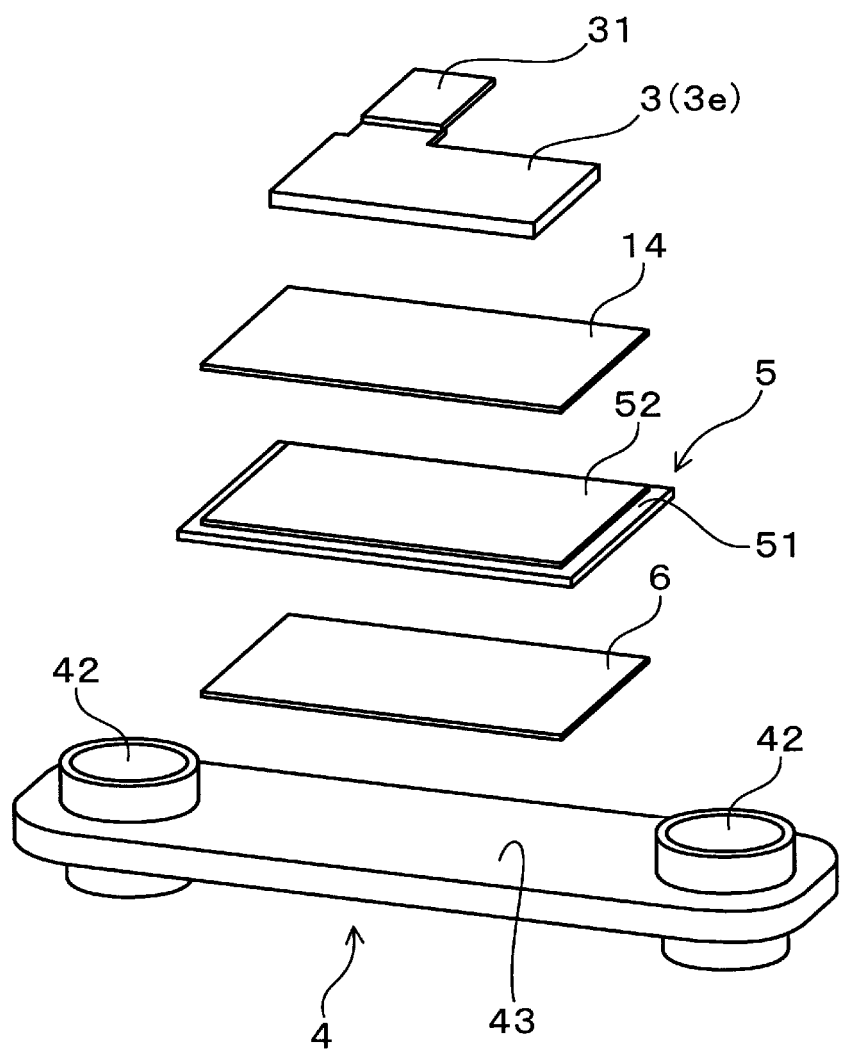
FIG. 9 is an explanatory perspective view of a manufacturing process for the second sub-assembly according to the first embodiment.

Meanwhile, the second sub-assembly 102 shown in FIG. 5 is configured by the cooling tube 4, the insulating portion 5, and the lead frame 3e being laminated. In fabrication of the second sub-assembly 102, as shown in FIG. 9, the insulating portion 5 is joined to the opposing surface 43 of the cooling tube 4 by a brazing material that serves as the metal joining material 6. In addition, the lead frame 3e is joined to a surface of the insulating portion 5 on the side opposite the cooling tube 4 by the brazing material 14. As a result, the sub-assembly 102 is formed.

Figure 10:
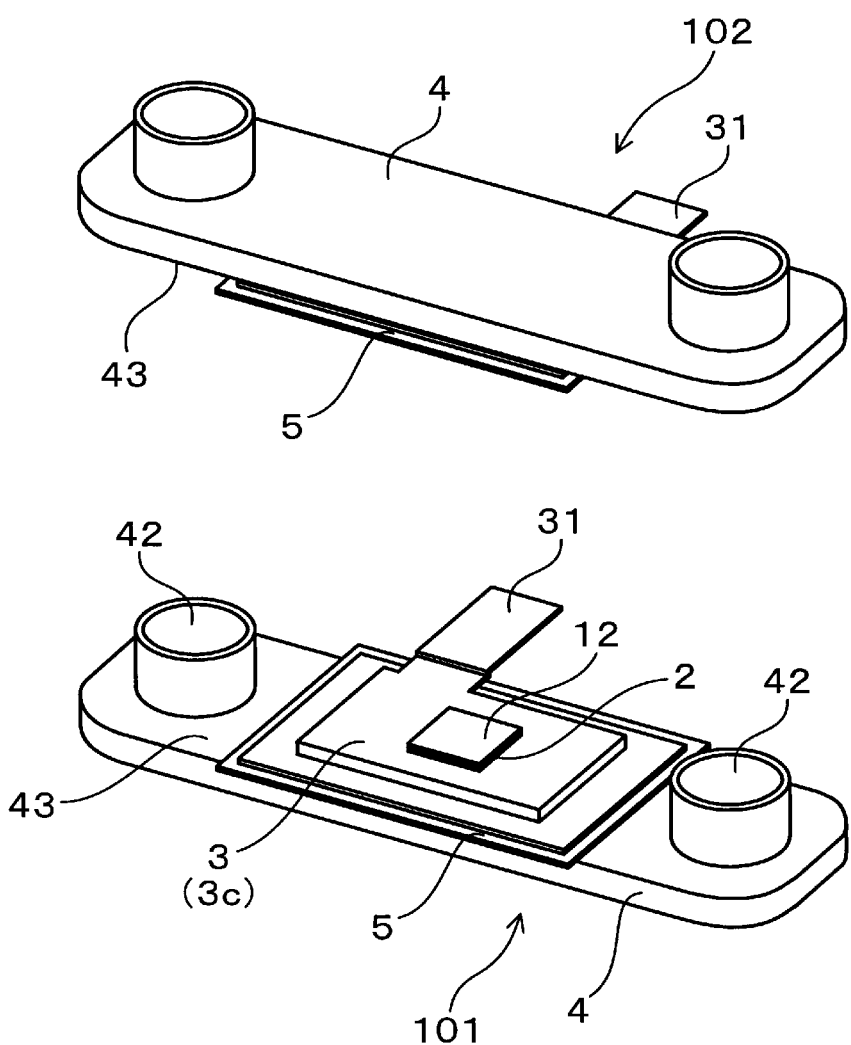
FIG. 10 is an explanatory perspective view of a manufacturing process for the semiconductor cooling assembly according to the first embodiment, showing an aspect in which the two sub-assemblies are arranged opposite to each other.
Figure 11:
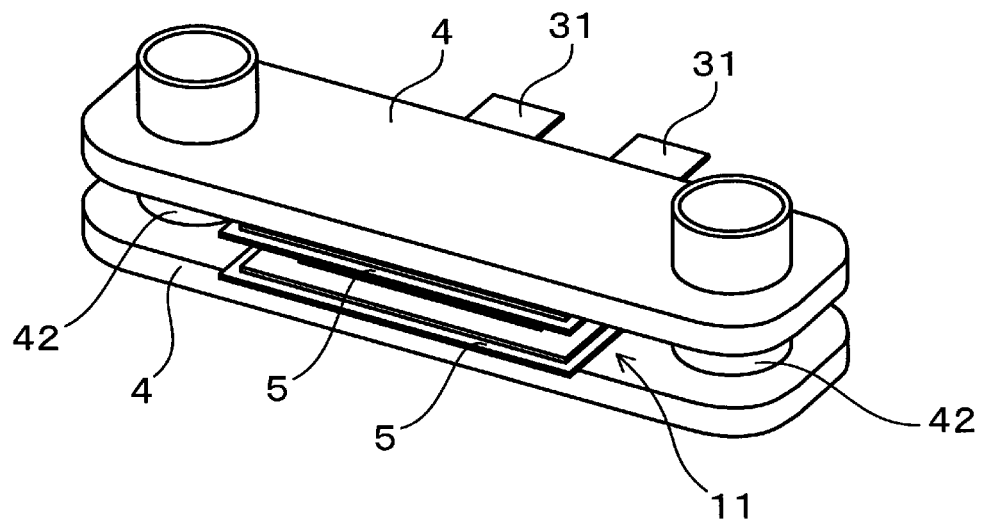
FIG. 11 is an explanatory perspective view of a manufacturing process for the semiconductor cooling assembly according to the first embodiment, showing an aspect in which the two sub-assemblies are combined.

Furthermore, as shown in FIG. 6 and FIG. 10, the first sub-assembly 101 and the second sub-assembly 102 are arranged such that the terminal chip 12 and the lead frame 3e oppose each other. In addition, as shown in FIG. 11, the first sub-assembly 101 and the second sub-assembly 102 are stacked together and joined via the solder 13 that is formed on the surface of the terminal chip 12.

From this state, the laminated component group 11 is sealed by resin in the space between the pair of cooling tubes 4, as shown in FIG. 1 and FIG. 2. The resin sealing portion 7 is formed to seal all of the components that are arranged between the pair of cooling tubes 4. However, the power terminal 31 that is a portion of the lead frame 3 is exposed from the resin sealing portion 7. Here, although not shown in the drawings, a control terminal that is connected to a gate of the semiconductor element 2 and the like is also exposed from the resin sealing portion 7. Here, for example, formation of the resin sealing portion 7 can be performed by a method according an eleventh embodiment or a twelfth embodiment, described hereafter.

A plurality of the semiconductor cooling assemblies 10 shown in FIG. 1, FIG. 2, and FIG. 12 that are obtained as described above are prepared. Then, as shown in FIG. 3, the plurality of semiconductor cooling assemblies 10 are laminated in the lamination direction X. The semiconductor cooling assemblies 10 that are adjacent to each other in the lamination direction X are joined as appropriate by the connecting portions 42 of the cooling tubes 4. As a result, the power conversion apparatus 1 shown in FIG. 3 is obtained.

Here, one of the connecting portions 42 of the cooling tube 4 that is arranged on one end in the lamination direction X serves as a coolant introducing portion 421 that introduces the coolant into the coolant flow passage 41 from outside. The other connecting portion 42 serves as a coolant discharging portion 422 that discharges the coolant outside from the coolant flow passage 41. In addition, the cooling tube 4 that is arranged on the other end in the lamination direction X is not provided with the connecting portions 42 on the surface that faces the outer side in the lamination direction X.

According to the present embodiment, the semiconductor element 2 is arranged on only one surface of the cooling tube 4 in the lamination direction X. That is, as shown in FIG. 1 and FIG. 2, the semiconductor cooling assembly 10 has the pair of cooling tubes 4 that are arranged opposite to each other in the lamination direction X. In addition, the semiconductor element 2 is arranged on only the opposing surface 43 side of the pair of cooling tubes 4. Therefore, as shown in FIG. 3, in the power conversion apparatus 1 in which the plurality of semiconductor cooling assemblies 10 are laminated, gap portions 44 between adjacent cooling tubes 4 include portions in which the laminated component group 11 including the semiconductor element 2 is arranged and portions in which the laminated component group 11 is not arranged.

In addition, the resin sealing portion 7 is arranged in the gap portion 44 in which laminated component group 11 is arranged. The resin sealing portion 7 is not arranged in the gap portion 44 in which the laminated component group 11 is not arranged. Here, in FIG. 3, the laminated component group 11 that is covered by the resin sealing portion 7 is not shown.

The gap portion 44 in which the laminated component group 11 and the resin sealing portion 7 are arranged and the gap portion 44 in which the laminated component group 11 and the resin sealing portion 7 are not arranged are present in an alternating manner in the lamination direction X.

Next, effects of the present embodiment will be described.

In the above-described power conversion apparatus 1, the insulating portion 5 and the cooling tube 4 are joined by the metal joining material 6. As a result, thermal resistance between the insulating portion 5 and the cooling tube 4 can be sufficiently reduced. Therefore, thermal resistance between the cooling tube 4 and the semiconductor element 2 can be reduced. Consequently, cooling performance of the semiconductor element 2 can be improved. In addition, the metal joining material 6 has high thermal conductivity. Therefore, thickness control of the metal joining material 6 can be relatively relaxed. Consequently, productivity regarding the power conversion apparatus 1 can be improved.

In addition, the semiconductor element 2 and the lead frame 3 are integrated with the cooling tubes 4 to form the semiconductor cooling assembly 10 by the resin sealing portion 7. That is, the semiconductor element 2 and the like are integrated with the flow-passage formation body (the cooling tubes 4 according to the present embodiment) by the resin sealing portion 7 that is required for electrical insulation protection of the semiconductor element 2. Consequently, manufacturing steps can be reduced. Productivity regarding the power conversion apparatus 1 can be improved.

In addition, the semiconductor cooling assembly 10 includes the pair of cooling tubes 4, and the resin sealing portion 7, the semiconductor element 2, and the lead frame 3 that are arranged between the pair of cooling tubes 4 and integrated with the pair of cooling tubes 4. As a result, an easy-to-manufacture power conversion apparatus 1 can be easily obtained.

In addition, the semiconductor element 2 is arranged on only one surface of the cooling tube 4 in the lamination direction X. As a result of this configuration, a more easy-to-manufacture power conversion apparatus 1 can be obtained.

Furthermore, the insulating portion 5 includes the ceramic substrate 51 and the pair of metal layers 52. As a result, joining of the insulating portion 5 and the cooling tube 4 and joining of the insulating portion 5 and the lead frame 3 can be easily and reliably performed. In addition, thermal resistance between the insulating portion 5 and the cooling tube 4, and thermal resistance between the insulating portion 5 and the lead frame 3 can be reduced. Consequently, thermal resistance between the cooling tubes 4 and the semiconductor element 2 can be effectively reduced. Cooling performance of the semiconductor element 2 can be effectively improved.

In addition, the metal layers 52 are respectively formed on both main surfaces of the ceramic substrate 51 in sections excluding the peripheral edge portions. As a result, insulation between the metal layers 52 on both main surfaces of the insulating portion 5 can be further improved. That is, even if close contact between the insulating portion 5 and the resin sealing portion 7 is not obtained and a gap is formed between the insulating portion 5 and the resin sealing portion 7, as a result of the arrangement of the metal layers 52 such as that described above, creepage distance between the two metal layers 52 can be ensured.

Furthermore, the cooling tube 4 includes the coolant flow passage 41 in the position that opposes the section to which the metal joining material 6 is joined. Consequently, a heat release path from the semiconductor element 2 to the coolant flow passage 41 via the metal joining material 6 can be further shortened. A more efficient heat release can be actualized.

Moreover, according to the present embodiment, the resin sealing portion 7 is formed to be away from the connecting portion 42. As a result, the structure can be such that the connecting portion 42 is easily and reliably sealed by metal joining, such as brazing.

As described above, according to the present embodiment, a power conversion apparatus that is capable of improving cooling performance of a semiconductor element and productivity can be provided.

Second Embodiment

Figure 13:
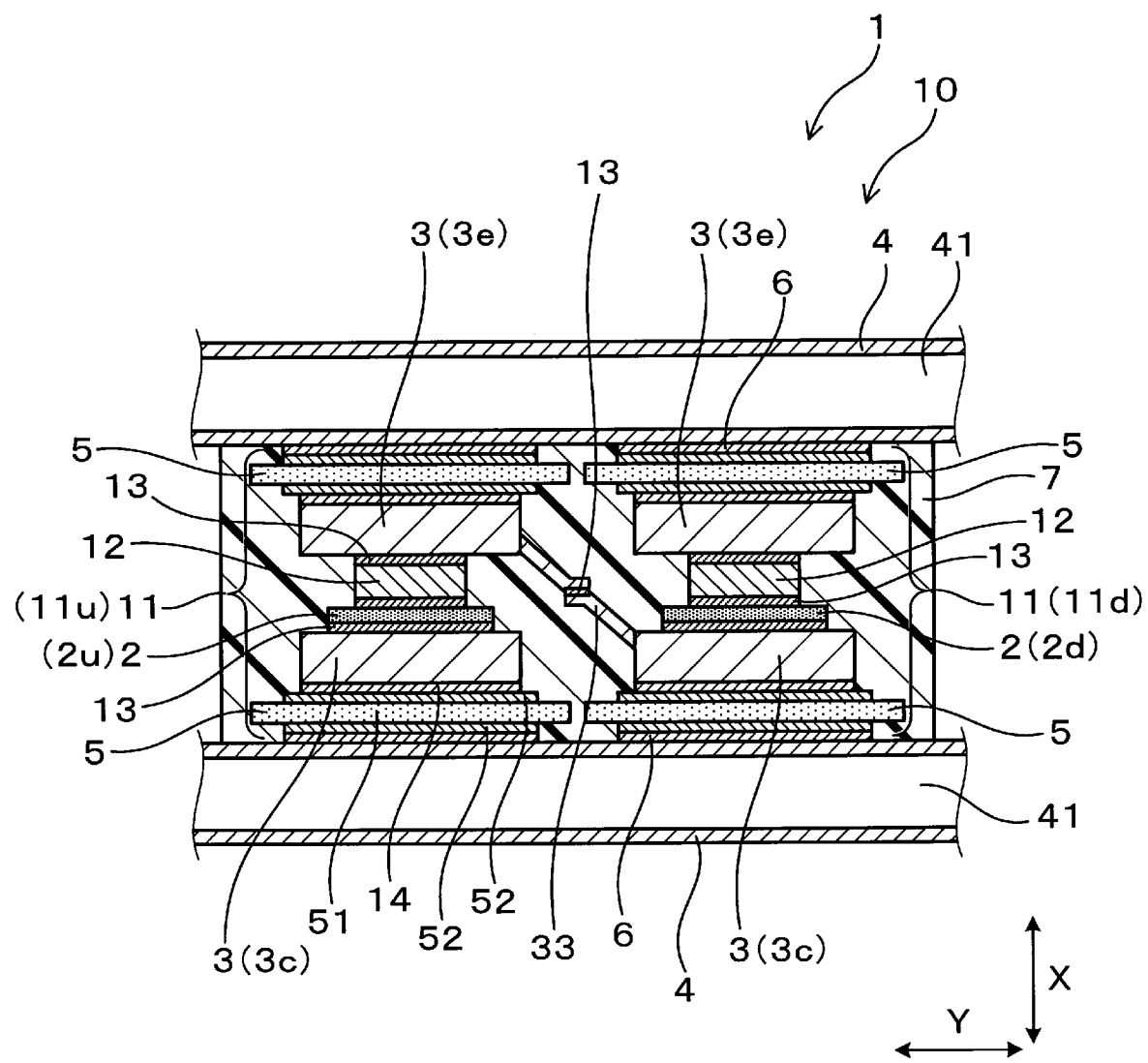
FIG. 13 is an explanatory cross-section view of a semiconductor cooling assembly according to a second embodiment.

As shown in FIG. 13, in the power conversion apparatus 1 according to a second embodiment, the semiconductor cooling assembly 10 includes a plurality of semiconductor elements 2. That is, a single semiconductor cooling assembly 10 includes a plurality of semiconductor elements 2 that are arranged side-by-side in a direction that is perpendicular to the lamination direction X, between the pair of cooling tubes 4. Here, FIG. 13 is a cross-section view of the semiconductor cooling assembly 10 taken in a plane that is perpendicular to the vertical direction Z.

According to the present embodiment, the plurality of semiconductor elements 2 are arranged side-by-side in the lateral direction Y.

In addition, of the plurality of semiconductor elements 2 in the semiconductor cooling assembly 10, at least two are an upper-arm semiconductor element 2u and a lower-arm semiconductor element 2d that are connected to each other in series. Here, according to the present embodiment, the semiconductor elements 2 that are provided inside the semiconductor cooling assembly 10 are two, and the semiconductor cooling assembly 10 includes a single upper-arm semiconductor element 2u and a single lower-arm semiconductor element 2d.

In the semiconductor cooling assembly 10, two lead frames 3, two insulating portions 5, and a single terminal chip 12 are laminated for a single semiconductor element 2. That is, the semiconductor cooling assembly 10 includes two laminated component groups 11. The two laminated component groups 11 are arranged side-by-side in the lateral direction Y between the pair of cooling tubes 4.

In addition, the lead frame 3e on the emitter side in a laminated component group 11u that includes the upper-arm semiconductor element 2u and the lead frame 3c on the collector side in a laminated component group 11d that includes the lower-arm semiconductor element 2d are configured to be electrically connected to each other and have a same electric potential. The lead frame 3e of the laminated component group 11u and the lead frame 3c of the laminated component group 11d are connected to each other by an internal terminal 33. The internal terminal 33 is also sealed by the resin sealing portion 7, together with the laminated component groups 11.

Figure 14:
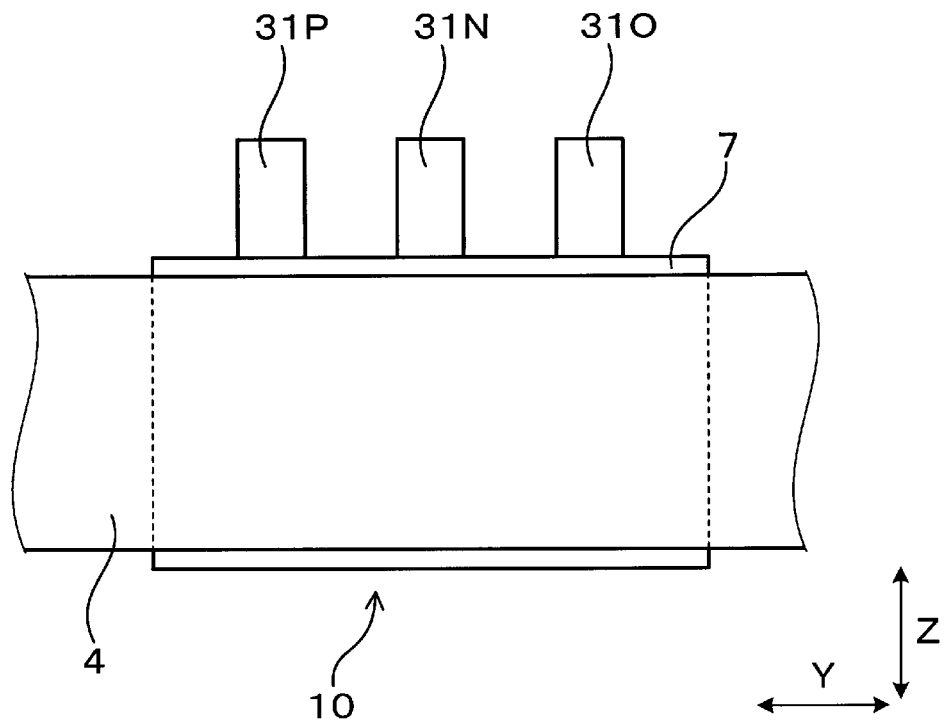
FIG. 14 is an explanatory front view of the semiconductor cooling assembly according to the second embodiment, viewed from a lamination direction.

However, as shown in FIG. 14, in the semiconductor cooling assembly 10, the power terminal 31 protrudes from the resin sealing portion 7. In the semiconductor cooling assembly 10, a positive power terminal 31P that is electrically connected to the upper-arm semiconductor element 2u and a negative power terminal 31N that is electrically connected to the lower-arm semiconductor element 2d protrude from the resin sealing portion 7 in a same direction. The positive power terminal 31P and the negative power terminal 31N are arranged to be adjacent to each other.

The positive power terminal 31P is a portion of the lead frame 3c of the laminated component group 11u. The negative power terminal 31N is a portion of the lead frame 3e of the laminated component group 11d. In addition, the semiconductor cooling assembly 10 includes an output power terminal 31O that is electrically connected to the lead frame 3e of the laminated component group 11u and the lead frame 3c of the laminated component group 11d. The output power terminal 31O also protrudes from the resin sealing portion 7 in the same direction as the positive power terminal 31P and the negative power terminal 31N. The three power terminals 31 are arranged side-by-side in the lateral direction Y with space between the three power terminals 31. In addition, the positive power terminal 31P and the negative power terminal 31N are arranged to be adjacent to each other in the lateral direction Y, as described above.

In manufacturing of the semiconductor cooling assembly 10, respective components are laminated onto one and the other of the pair of cooling tubes 4. The sub-assemblies 101 and 102 shown in FIG. 15 and FIG. 16 are fabricated.

Figure 15:
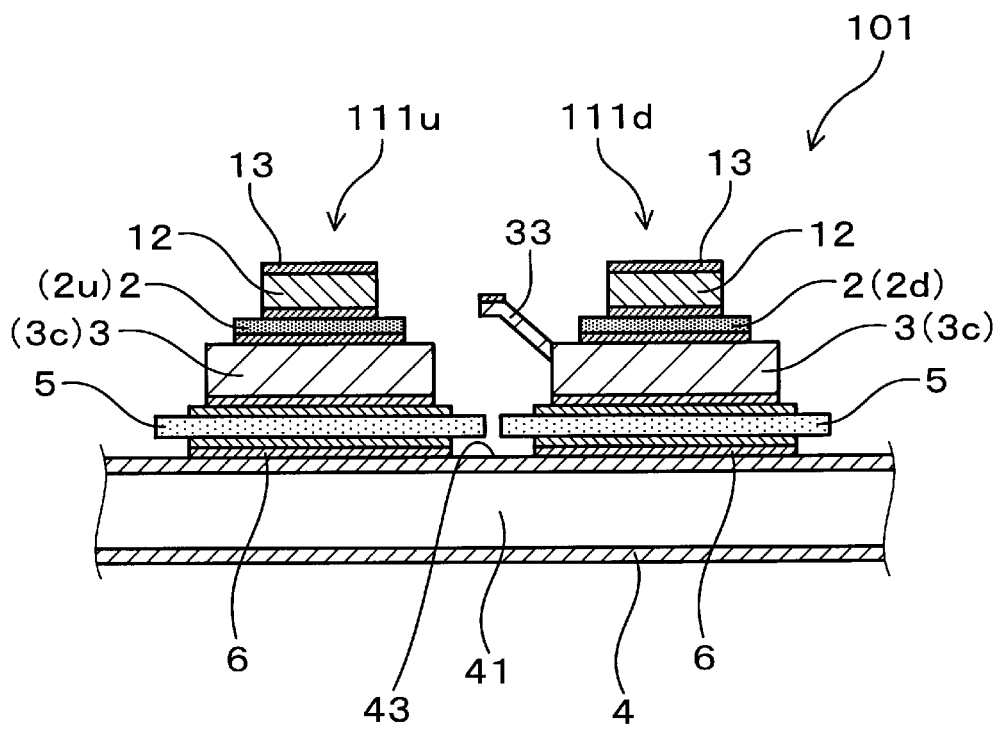
FIG. 15 is an explanatory cross-section view of a first sub-assembly according to the second embodiment.

The first sub-assembly 101 shown in FIG. 15 is configured by the insulating portion 5, the lead frame 3c, the semiconductor element 2, and the terminal chip 12 being laminated in two sections of one main surface of the cooling tube 4. That is, two half laminated bodies 111u and 111d are formed by the components being laminated in a substantially similar configuration, in parallel, on the opposing surface 43 of one cooling tube 4. In addition, the lead frame 3c of one half laminated body 111d includes the internal terminal 33.

Figure 16:
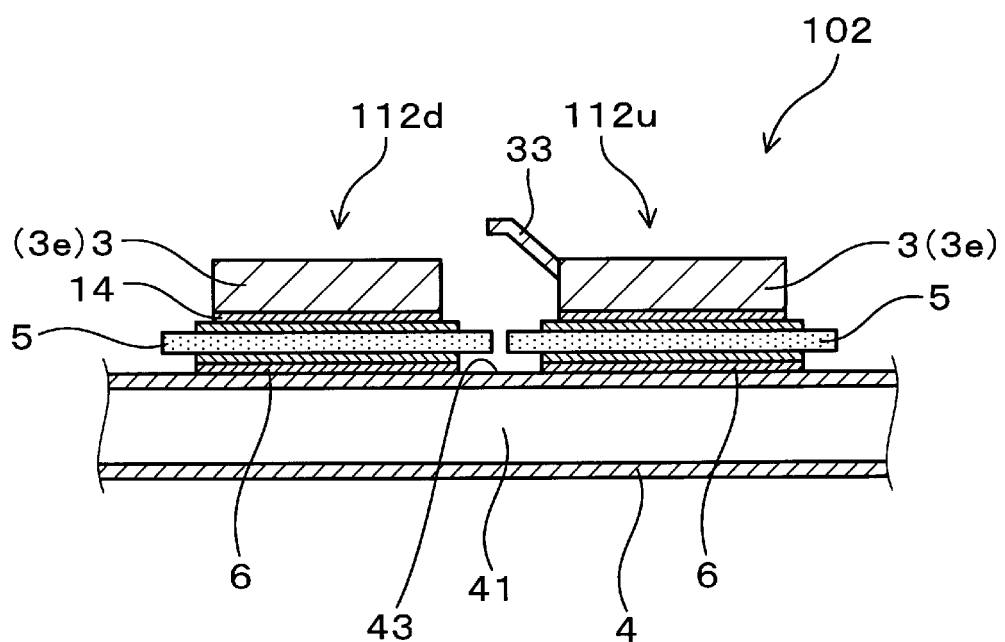
FIG. 16 is an explanatory cross-section view of a second sub-assembly according to the second embodiment.

Meanwhile, the second sub-assembly 102 shown in FIG. 16 is configured by the insulating portion 5 and the lead frame 3e being laminated in two sections on one main surface of the cooling tube 4. In a manner similar to that of the first sub-assembly 101 described above, two half laminated bodies 112u and 112d are formed by the components being laminated in a substantially similar configuration, in parallel, on the opposing surface 43 of one cooling tube 4. In addition, the lead frame 3e of one half laminated body 112u includes the internal terminal 33.

Figure 17:
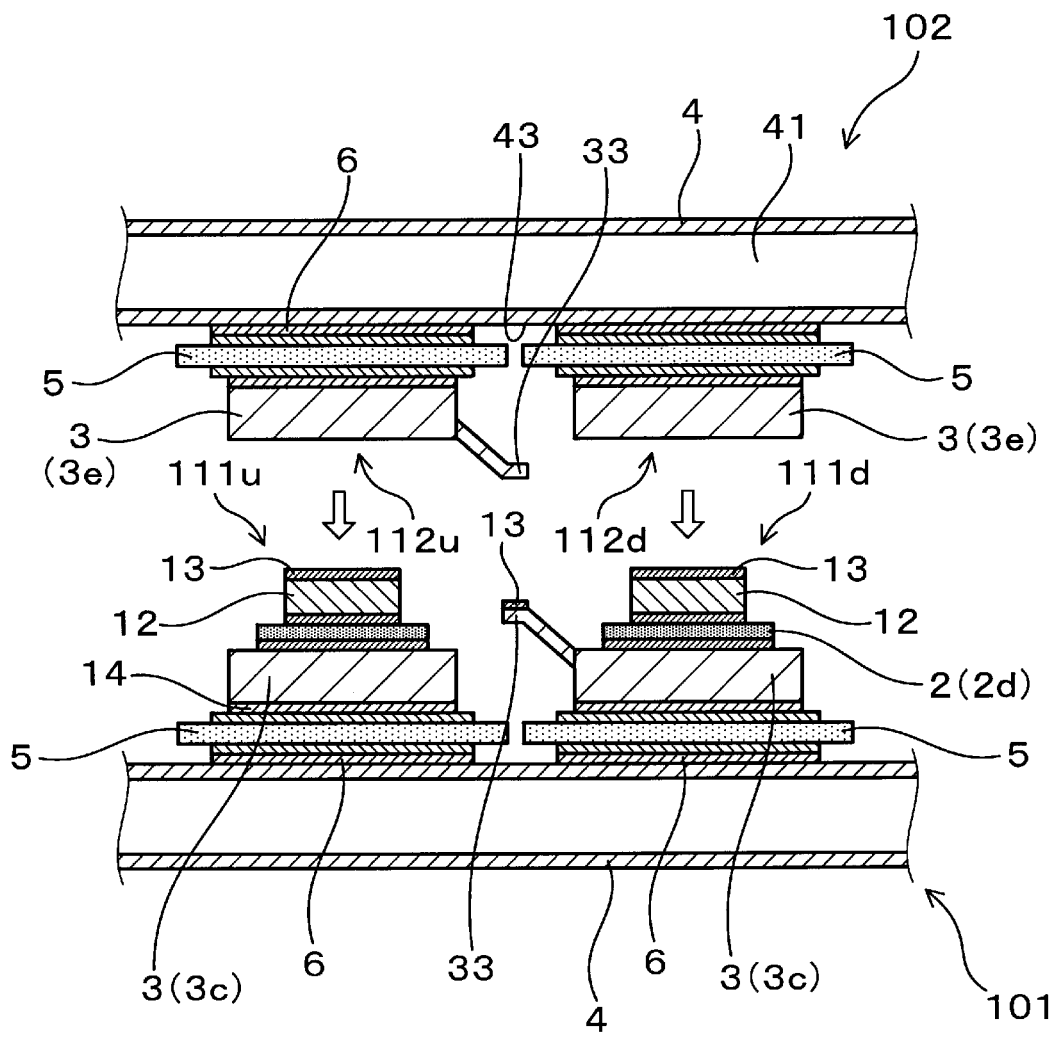
FIG. 17 is an explanatory cross-section view of a manufacturing process for the semiconductor cooling assembly according to the second embodiment, showing an aspect in which the two sub-assemblies are combined.

In addition, as shown in FIG. 17, the two sub-assemblies 101 and 102 are arranged opposite to each other such that the cooling tubes 4 are on the outer sides. The two sub-assemblies 101 and 102 are then stacked and joined. At this time, the half laminated body 111*u* and the half laminated body 112*u* overlap, and the half laminated body 111*d* and the half laminated body 112*d* overlap. As a result, the two terminal chips 12 in the first sub-assembly 101 and the two lead frames 3*e* in the second sub-assembly 102 are connected via the solder 13. In addition, the internal terminal 33 of the first sub-assembly 101 and the internal terminal 33 of the second sub-assembly 102 also overlap with each other. Furthermore, the two internal terminals 33 are joined to each other via the solder 13.

In addition, as shown in FIG. 13, the resin sealing portion 7 is formed to cover the two laminated component groups 11 in the space between the pair of cooling tubes 4. The semiconductor cooling assembly 10 is thereby fabricated.

Other configurations are similar to those according to the first embodiment. Here, among reference numbers used according to the second and subsequent embodiments, reference numbers that are identical to those used according to a previous embodiment indicate constituent elements and the like that are similar to those according to the previous embodiment unless particularly stated otherwise.

According to the present embodiment, the semiconductor cooling assembly 10 includes the plurality of semiconductor elements 2 that are arranged side-by-side in a direction perpendicular to the lamination direction X, between the pair of cooling tubes 4. Therefore, size reduction of the power conversion apparatus 1 in the lamination direction X can be obtained. In addition, the resin sealing portion 7 and the cooling tube 4 can be bonded over a relatively wide area. Consequently, structural stability of the semiconductor cooling assembly 10 can be easily obtained.

The two semiconductor elements 2 of the semiconductor cooling assembly 10 are the upper-arm semiconductor element 2*u* and the lower-arm semiconductor element 2*d* that are connected to each other in series. Therefore, the upper-arm semiconductor element 2*u* and the lower-arm semiconductor element 2*d* can be connected inside the single semiconductor cooling assembly 10. Consequently, wiring between the upper-arm semiconductor element 2*u* and the lower-arm semiconductor element 2*d* can be shortened. Reduction of inductance can be obtained.

In addition, in the semiconductor cooling assembly 10, the positive power terminal 31P and the negative power terminal 31N protrude from the resin sealing portion 7 in the same direction as each other and are arranged to be adjacent to each other. Consequently, reduction of inductance can be further obtained.

Furthermore, according to the present embodiment, the insulating portions 5 of the two laminated component groups 11 are separate from each other. Therefore, an amount of material used for the insulating portion 5 can be suppressed. Cost reduction can be facilitated. In addition, the size of a single insulating portion 5 can be reduced. Cost reduction can be facilitated as a result of the size reduction, as well.

Other effects are similar to those of the first embodiment.

Third Embodiment

Figure 18:
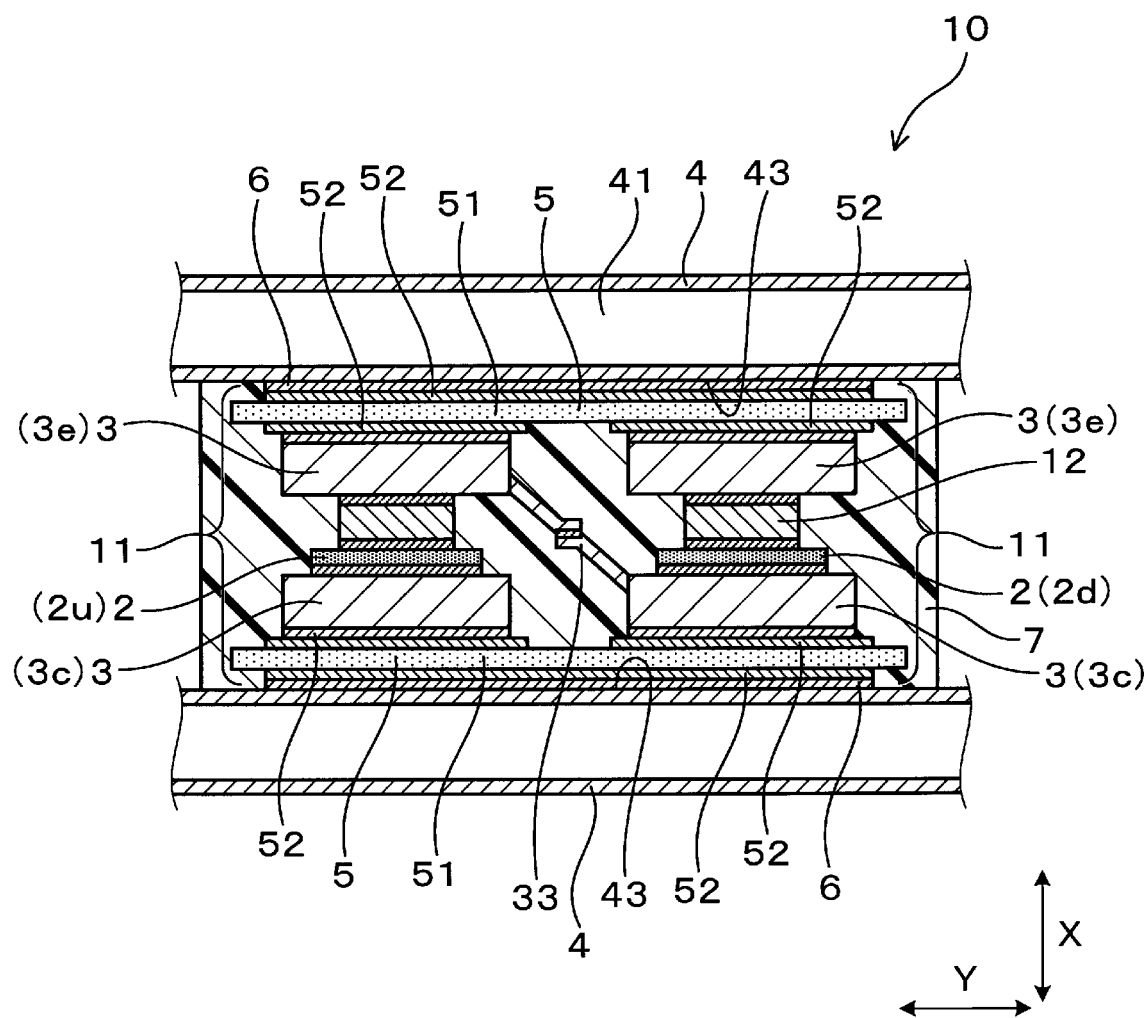
FIG. 18 is an explanatory cross-section view of a semiconductor cooling assembly according to a third embodiment.
Figure 19:
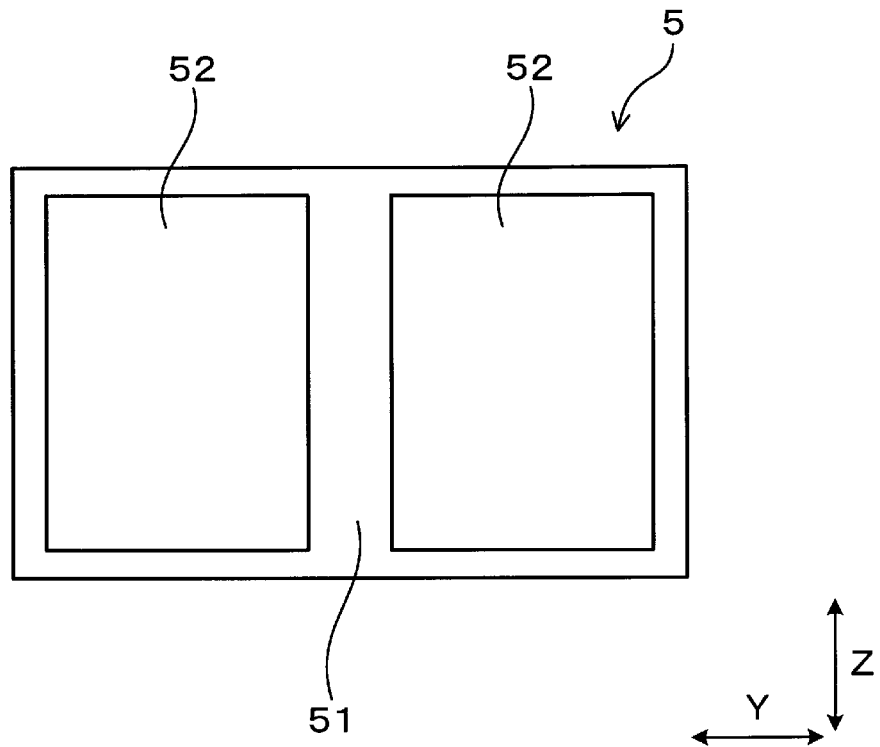
FIG. 19 is a plan view of an inner side surface of an insulating portion according to the third embodiment.
Figure 20:
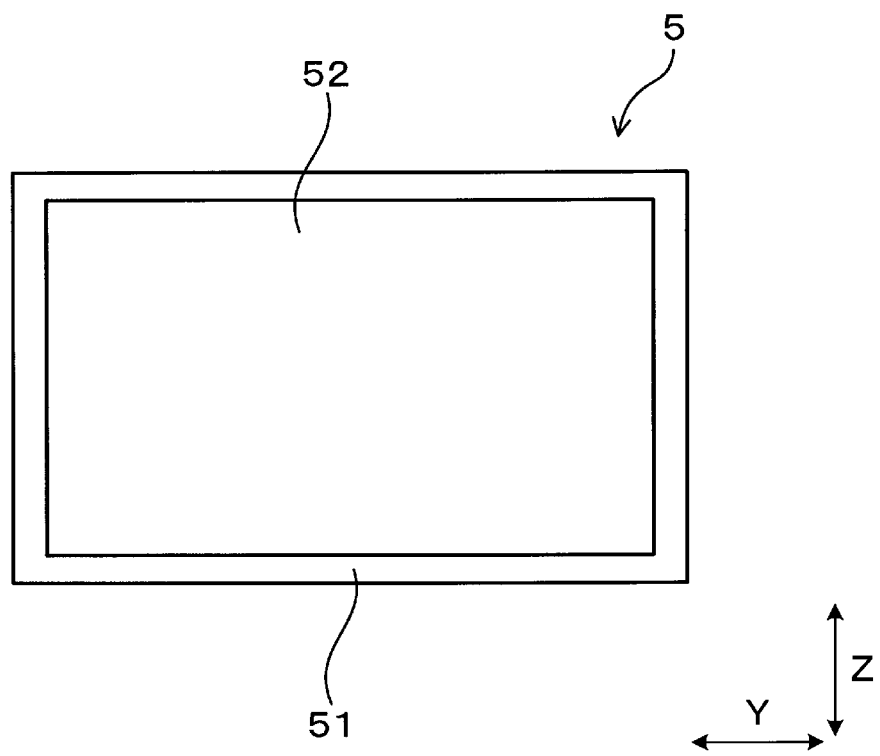
FIG. 20 is a plan view of an outer side surface of the insulating portion according to the third embodiment.

As shown in FIG. 18 to FIG. 20, the power conversion apparatus 1 according to a third embodiment has a configuration in which the insulating portion 5 is arranged over two laminated component groups 11.

That is, as shown in FIG. 18, the two laminated component groups 11 share two sheets of the insulating portion 5. One sheet of the insulating portion 5 is joined to the opposing surface 43 of one cooling tube 4 by the metal joining material 6. In addition, one sheet of the insulating portion 5 is joined to the opposing surface 43 of the other cooling tube 4 by the metal joining material 6. In addition, two semiconductor elements 2 are arranged in parallel, together with the lead frames 3 and the terminal chips 12 between the pair of insulating portions 5 that are arranged opposite to each other in the lamination direction X.

In addition, according to the present embodiment, as shown in FIG. 18 and FIG. 19, on one main surface of the insulating portion 5, two metal layers 52 are formed in two sections to be insulated from each other. That is, in the insulating portion 5, the two metal layers 52 that are separated from each other in the lateral direction Y are formed on an inner side surface of the ceramic substrate 51. The lead frames 3 that belong to separate laminated component groups 11 are respectively joined to the two metal layers 52.

Meanwhile, as shown in FIG. 18 and FIG. 20, a single metal layer 52 is formed on an outer side surface of the ceramic substrate 51. In addition, this single metal layer 52 is metal joined to the opposing surface 43 of the cooling tube 4. Here, in the ceramic substrate 51, the outer side surface refers to the surface on the cooling tube 4 side. The inner side surface refers to the surface on the semiconductor element 2 side.

Other configurations are similar to those according to the second embodiment.

According to the present embodiment, the two laminated component groups 11 share two sheets of the insulating portion 5. The number of components can be reduced. As a result, productivity regarding the power conversion apparatus 1 can be improved. In addition, the ceramic substrate 51 of the insulating portion 5 is arranged in a continuous manner, including between the two laminated component groups 11. Therefore, insulation between both surfaces of the insulating portion 5 can be more easily ensured. That is, although the insulating portion 5 is sealed by the resin sealing portion 7, in some cases, a gap may be formed on an interface between the insulating portion 5 and the resin sealing portion 7. In this case, compared to a configuration in which the insulating portions 5 are separated between the two laminated component groups 11, the configuration in which the ceramic substrate 51 is continuous is more preferable in terms of ensuring insulation between both main surfaces of the ceramic substrate 51.

Other effects are similar to those of the second embodiment.

Fourth Embodiment

Figure 21:
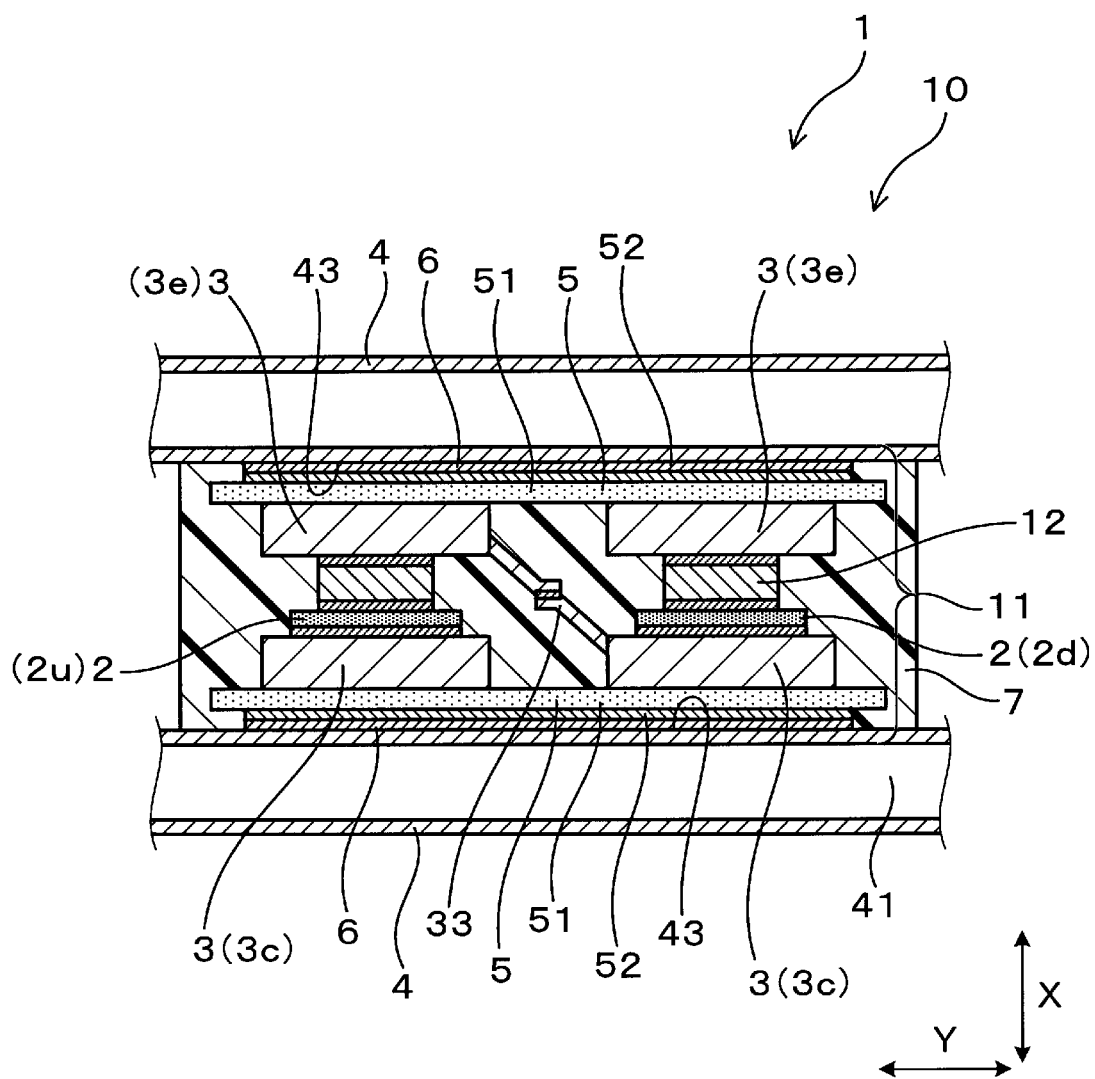
FIG. 21 is an explanatory cross-section view of a semiconductor cooling assembly according to a fourth embodiment.
Figure 22:
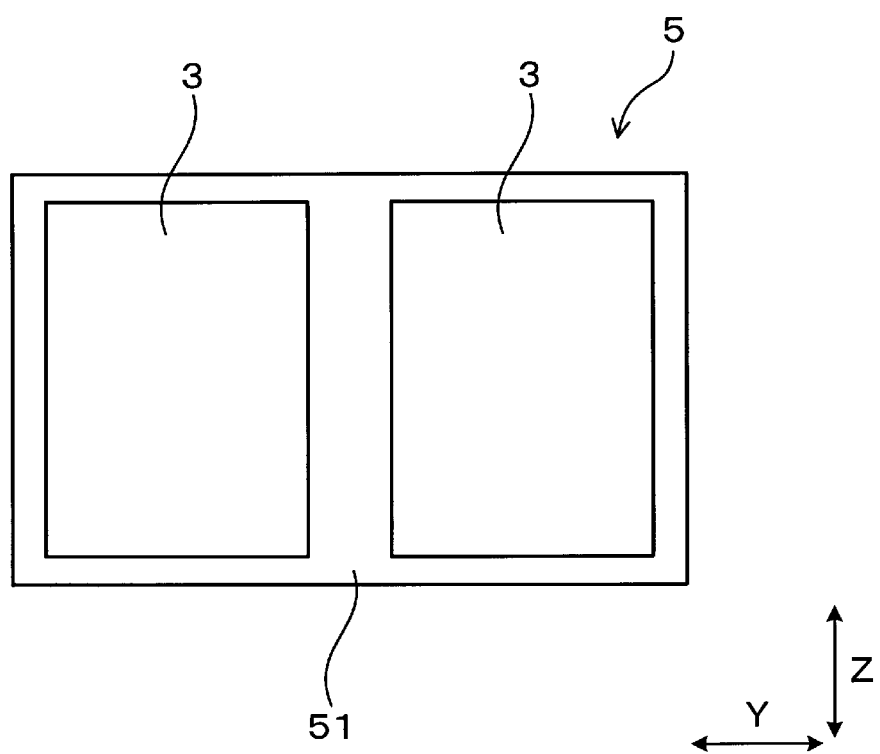
FIG. 22 is a plan view of an inner side surface of an insulating portion that is integrated with a lead frame, according to the fourth embodiment.

As shown in FIG. 21 and FIG. 22, in the power conversion apparatus 1 according to a fourth embodiment, the insulating portion 5 is not provided with the metal layer 52 on the inner side surface of the ceramic substrate 51.

In addition, the lead frame 3 is directly joined to the ceramic substrate 51. That is, instead of the metal layer 52 being provided, the lead frame 3 is provided on the inner side surface of the ceramic substrate 51. For example, joining of the ceramic substrate 51 and the lead frame 3 can be performed by brazing. More specifically, the lead frame 3 can be joined to the inner side surface of the ceramic substrate 51 by an active metal brazing method. That is, preparing in advance the ceramic substrate 51 in which the metal layer 52 is formed on one surface in a manner similar to that according to the second embodiment and the lead frame 3 is joined to the other surface can be considered.

Other configurations are similar to those according to the second embodiment.

According to the present embodiment, heat resistance between the cooling tube 4 and the semiconductor element 2 can be reduced by an amount amounting to a reduction in the components between the cooling tube 4 and the semiconductor element 2. Therefore, cooling efficiency can be further improved. However, in terms of more easily preventing warping that is caused by a difference in thermal expansion between both surfaces of the insulating portion 5, the insulating portion 5 in which the metal surface layers 52 are formed on both main surfaces, as according to the second embodiment and the like, is preferably used.

Other effects are similar to those of the first embodiment.

Fifth Embodiment

Figure 23:
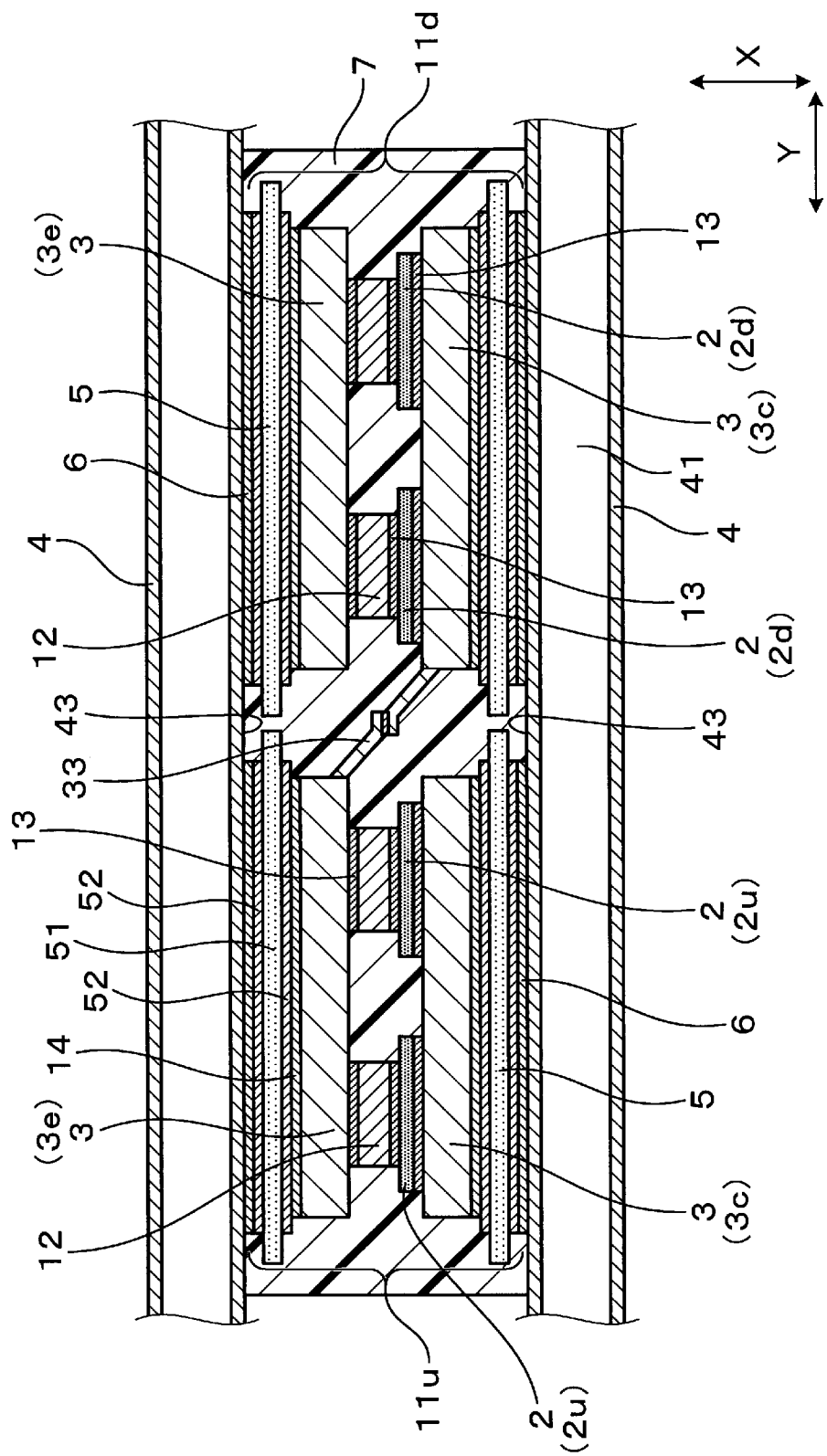
FIG. 23 is an explanatory cross-section view of a semiconductor cooling assembly according to a fifth embodiment.
Figure 24:
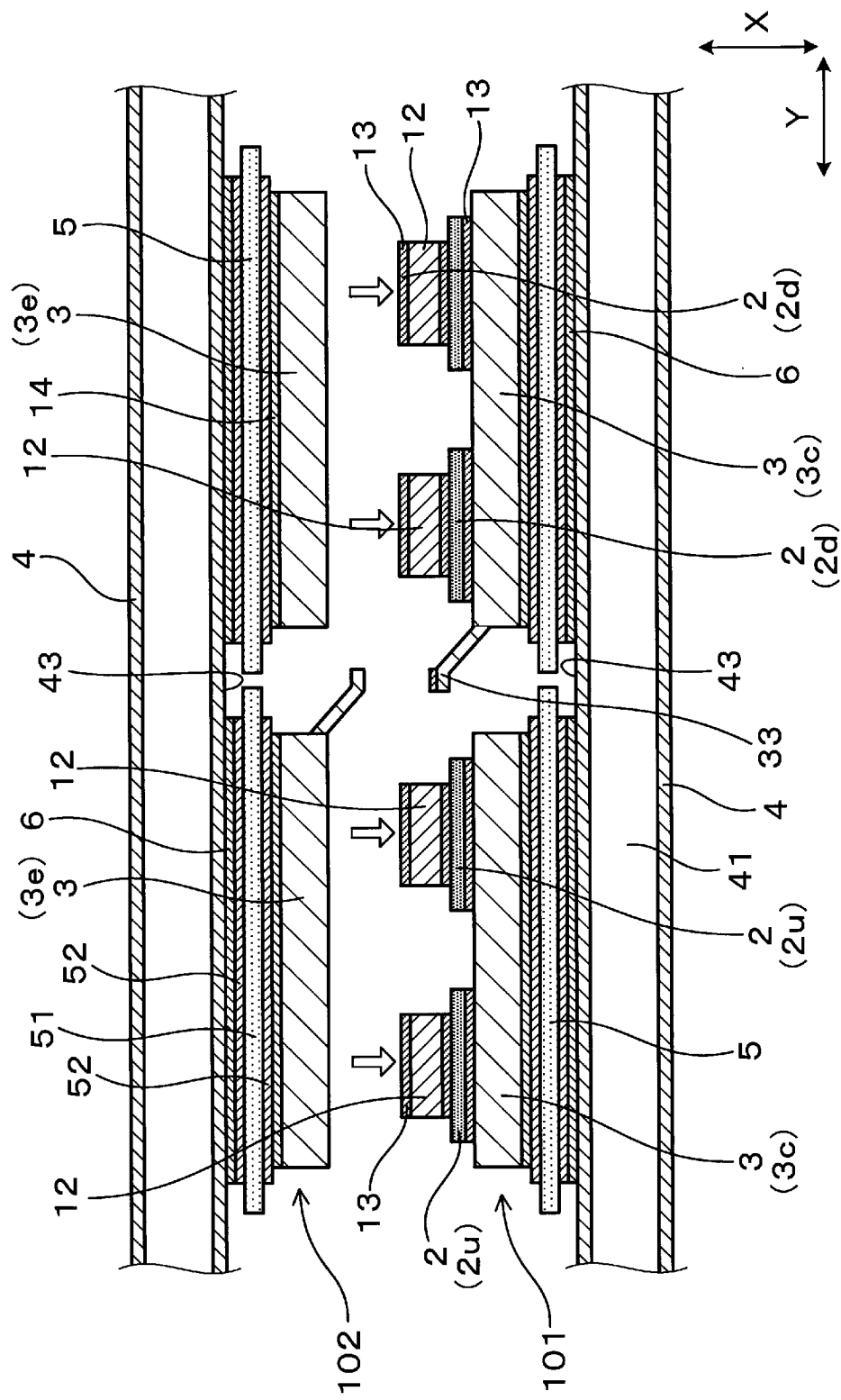
FIG. 24 is an explanatory cross-section view of two sub-assemblies that are arranged opposite to each other according to the fifth embodiment.

As shown in FIG. 23 and FIG. 24, in the power conversion apparatus 1 according to a fifth embodiment, the semiconductor cooling assembly 10 includes two upper-arm semiconductor elements 2u that are connected to each other in parallel and two lower-arm semiconductor elements 2d that are connected to each other in parallel.

The present embodiment is similar to the second embodiment in that the semiconductor cooling assembly 10 includes two laminated component groups 11. However, the present embodiment differs from the second embodiment in that each laminated component group 11 includes two semiconductor elements 2. That is, in the laminated component group 11u, two upper-arm semiconductor elements 2u are arranged side-by-side in the lateral direction Y between the pair of lead frames 3. In a similar manner, in the laminated component group 11d as well, two lower-arm semiconductor elements 2d are arranged side-by-side in the lateral direction Y between the pair of lead frames 3. In addition, an individual terminal chip 12 is laminated onto each semiconductor element 2 in the lamination direction X.

Furthermore, in manufacturing of the semiconductor cooling assembly 10, as shown in FIG. 24, the first sub-assembly 101 and the second sub-assembly 102 that include the four semiconductor elements 2 and the four terminal chips 12 are prepared. In addition, the first sub-assembly 101 and the second sub-assembly 102 are combined such that the four terminal chips 12 are joined to the lead frame 3e via the solder 13.

Other configurations are similar to those according to the second embodiment.

According to the present embodiment, in the power conversion apparatus 1 that uses the two semiconductor elements 2 that are connected in parallel, size reduction can be effectively obtained. In addition, reduction of inductance can be obtained by wiring between the semiconductor elements 2 being effectively shortened.

Other effects are similar to those of the first embodiment.

Here, according to the above-described embodiments, a configuration in which two semiconductor elements 2 are connected in parallel is given. However, a configuration in which three or more semiconductor elements 2 are connected in parallel is also possible.

Sixth Embodiment

Figure 25:
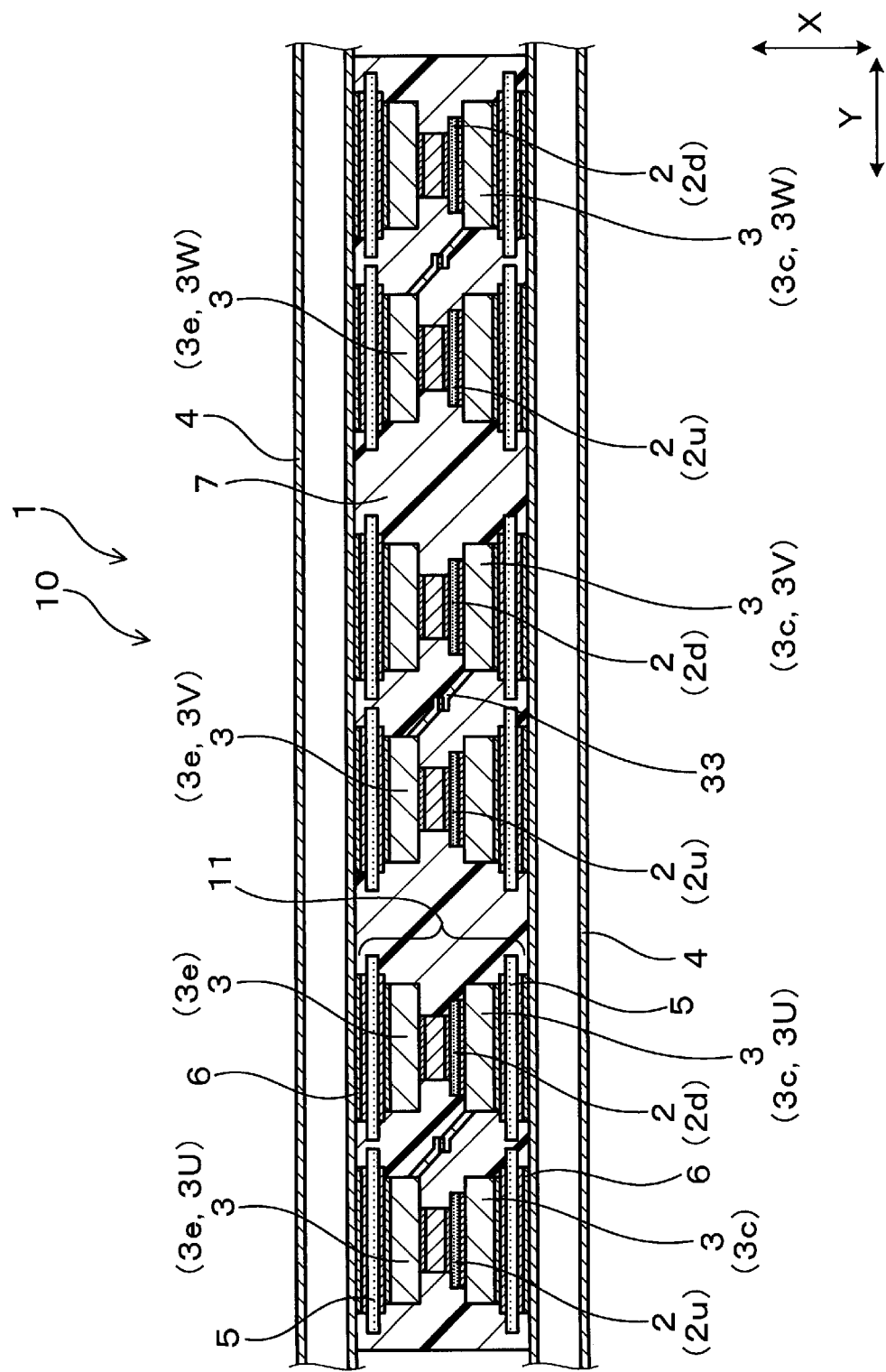
FIG. 25 is an explanatory cross-section view of a semiconductor cooling assembly according to a sixth embodiment.
Figure 26:
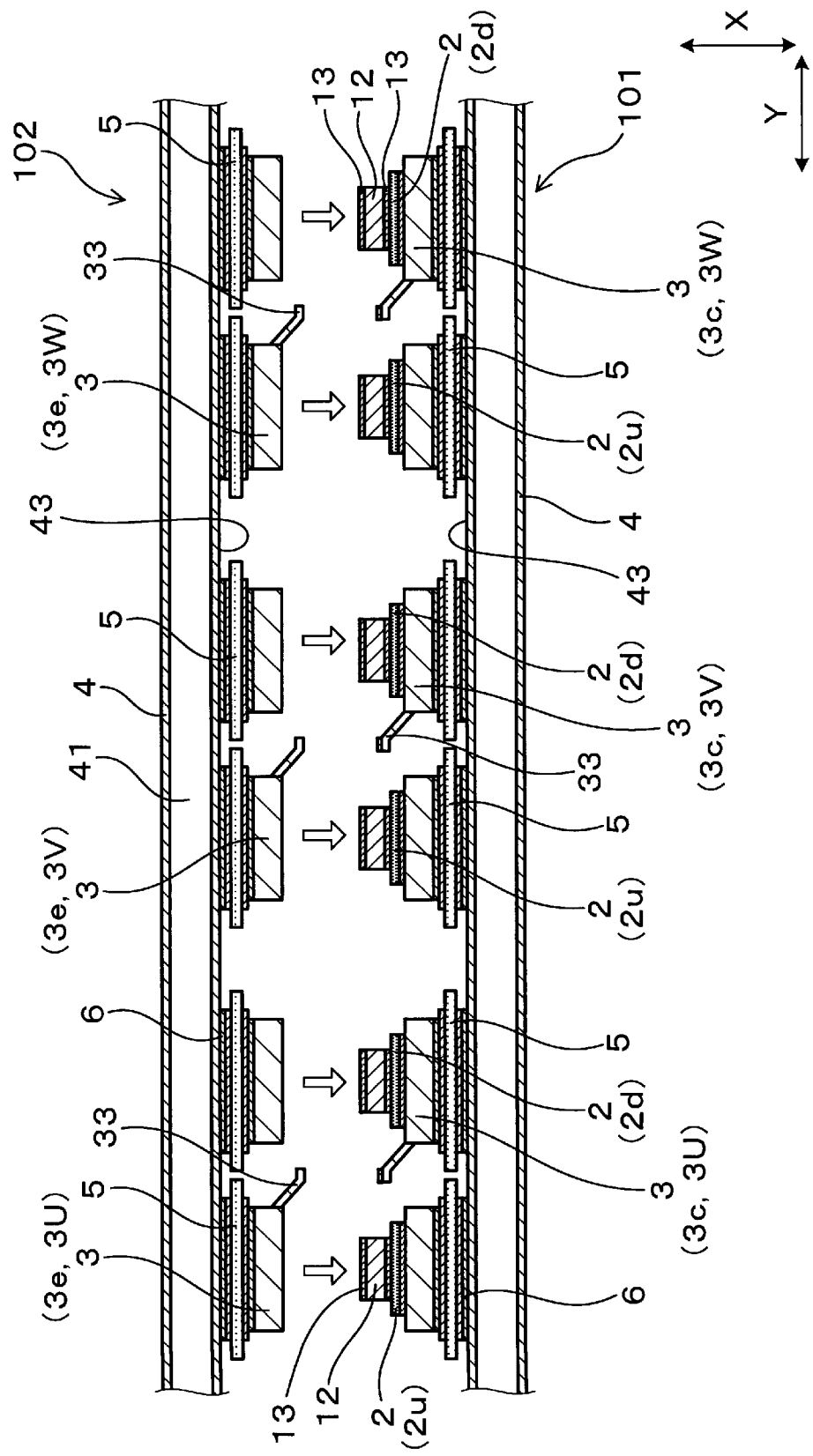
FIG. 26 is an explanatory cross-section view of two sub-assemblies that are arranged opposite to each other according to the sixth embodiment.

As shown in FIG. 25 and FIG. 26, in the power conversion apparatus 1 according to a sixth embodiment, the semiconductor cooling assembly 10 includes three sets of the upper-arm semiconductor element 2u and the lower-arm semiconductor element 2d that are connected to each other in series.

The power conversion apparatus 1 is configured to convert direct-current power to three-phase alternating-current power. In addition, a switching circuit portion includes three legs that are respectively connected to electrodes of three phases, that is, a U-phase, a V-phase, and a W-phase of a three-phase alternating-current load. Each leg is configured by the upper-arm semiconductor element 2u and the lower-arm semiconductor element 2d that are connected to each other in series. In addition, in each leg, an electrical connection point between the upper-arm semiconductor element 2u and the lower-arm semiconductor element 2d is connected to an electrode of the U-phase, V-phase, or W-phase of the three-phase alternating-current load.

In this manner, two semiconductor elements 2 that configure the U-phase leg, two semiconductor elements 2 that configure the V-phase leg, and two semiconductor elements 2 that configure the W-phase leg are provided in a single semiconductor cooling assembly 10. In addition, lead frames 3U, 3V and 3W that are a portion of the plurality of lead frames 3 that are laminated onto the semiconductor elements 2 are respectively electrically connected to output power terminals that are connected to the U-phase, V-phase, and W-phase electrodes of the three-phase alternating current load.

According to the present embodiment, in manufacturing of the semiconductor cooling assembly 10, as shown in FIG. 26, the first sub-assembly 101 and the second sub-assembly 102 that include six semiconductor elements 2 and six terminal chips 12 are prepared. In addition, the first sub-assembly 101 and the second sub-assembly 102 are combined such that the six terminal chips 12 are joined to the lead frame 3e via the solder 13.

Other configurations are similar to those according to the second embodiment.

Seventh Embodiment

As shown in FIG. 27 to FIG. 30, the power conversion apparatus 1 according to a seventh embodiment has a configuration in which the semiconductor elements 2 are arranged on both main surfaces of the cooling tube 4.

That is, in the cooling tube 4, the semiconductor elements 2 are arranged on both cooling surfaces 431 and 432 that are on opposite sides of each other in the lamination direction X.

Figure 27:
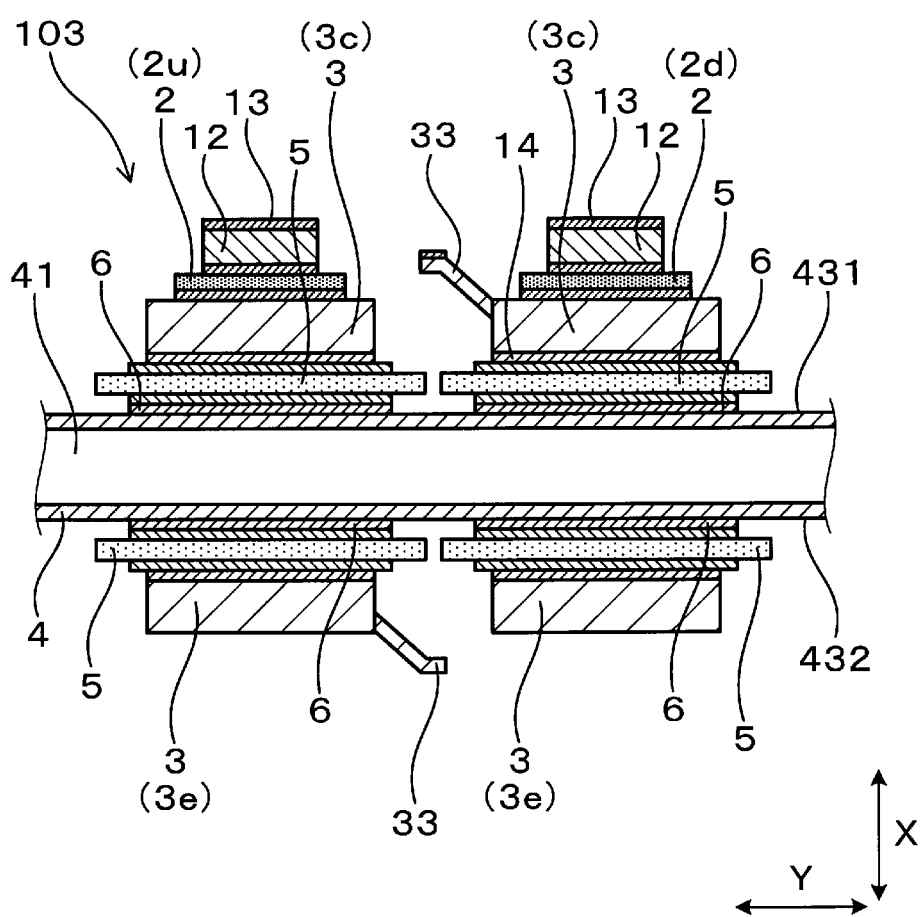
FIG. 27 is an explanatory cross-section view of a sub-assembly according to a seventh embodiment.

In manufacturing of the power conversion apparatus 1 according to the present embodiment, first, as shown in FIG. 27, the components are laminated onto both cooling surfaces 431 and 432 of the cooling tube 4. Here, the insulating portion 5, the lead frame 3c, the semiconductor element 2, and the terminal chip 12 are laminated onto one cooling surface 431 of the cooling tube 4. In addition, the insulating portion 5 and the lead frame 3e are laminated onto the other cooling surface 432 of the cooling tube 4. A single sub-assembly 103 is obtained in this manner.

Figure 28:
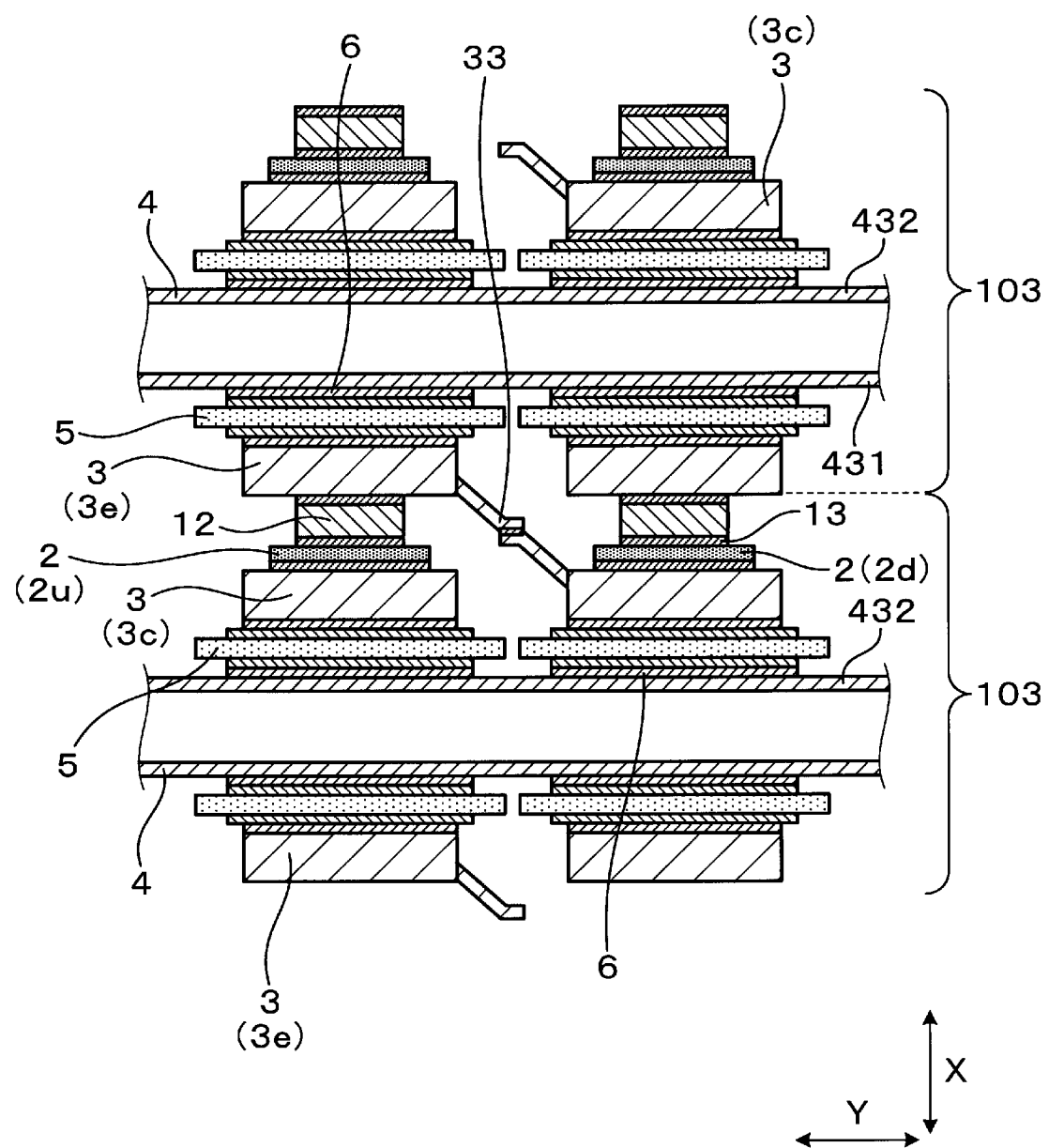
FIG. 28 is an explanatory cross-section view of two laminated sub-assemblies according to the seventh embodiment.

Then, a plurality of similar sub-assemblies 103 are fabricated. The plurality of sub-assemblies 103 are laminated as shown in FIG. 28. Here, the sub-assemblies 103 that are adjacent to each other in the lamination direction X are stacked such that the terminal chip 12 and the lead frame 3e are joined via the solder 13. In addition, the internal terminals 33 of the lead frames 3 are also overlapped and joined together.

Figure 29:
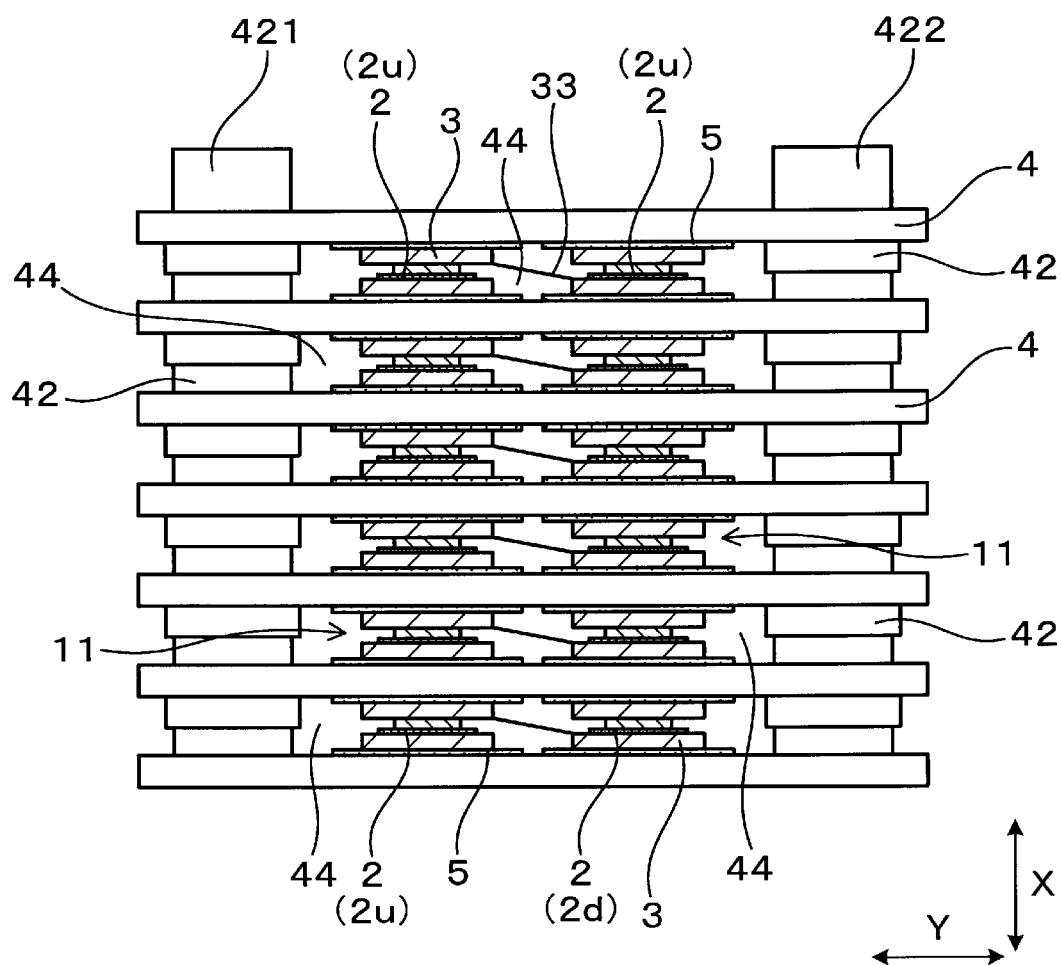
FIG. 29 is an explanatory plan view of a state in which numerous sub-assemblies are laminated according to the seventh embodiment.

In this manner, a plurality of sub-assemblies 103 are laminated in the lamination direction X. A laminated body such as that shown in FIG. 29 is thereby formed. In addition, when the sub-assemblies 103 are laminated, the connecting portions 42 of the cooling tubes 4 are also joined together.

However, the sub-assembly 102 shown in FIG. 16 according to the second embodiment is arranged on one end in the lamination direction X and the sub-assembly 101 shown in FIG. 15 according to the second embodiment is arranged on the other end in the lamination direction X.

Figure 30:
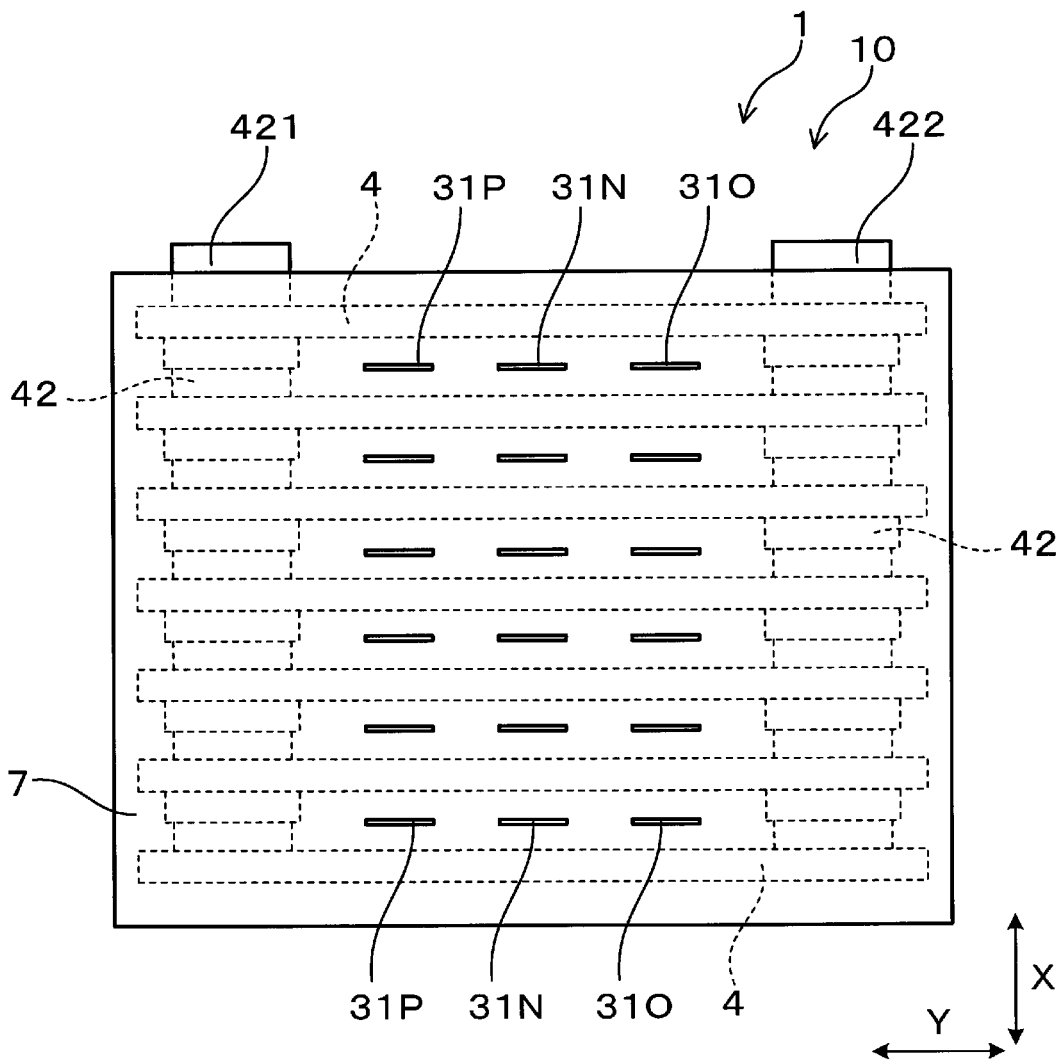
FIG. 30 is an explanatory plan view of a power conversion apparatus according to the seventh embodiment.

Then, as shown in FIG. 30, a portion of the laminated body is sealed by the resin sealing portion 7. According to the present embodiment, in addition to the semiconductor element 2, the lead frame 3, and the insulating portion 5, the cooling tube 4 is also sealed inside the resin sealing portion 7. In this case, the semiconductor cooling assembly 10 is configured by all of the cooling tubes 4 and all of the laminated component groups 11 in the laminated body, and the resin sealing portion 7.

Here, broken lines in FIG. 30 indicate only the shape of the cooling tubes 4 inside the resin sealing portion 7. This similarly applies to FIG. 32, described hereafter.

The power conversion apparatus 1 includes the gap portion 44 between the cooling tubes 4 that are adjacent to each other in the lamination direction X. The gap portion 44 is provided in a plurality of sections in the lamination direction X. The semiconductor elements 2 are arranged, together with the lead frame 3, in a plurality of sections of the gap portion 44. In addition, the three or more cooling tubes 4, and the semiconductor elements 2, the lead frames 3, and the insulating portions 5 in a plurality of gap portions 44 are integrated by the resin sealing portion 7. The connecting portions 42 of the cooling tubes 4 are also sealed by the resin sealing portion 7. In particular, according to the present embodiment, all of the cooling tubes 4 and all of the laminated component groups 11 that are laminated are sealed and integrated by the resin sealing portion 7. A single semiconductor cooling assembly 10 is thereby formed.

Here, the power terminals 31P, 31N, and 31O protrude from the resin sealing portion 7.

In addition, the coolant introducing portion 421 that introduces the coolant into the coolant flow passage 41 and the coolant discharging portion 422 that discharges the coolant from the coolant flow passage 41 protrude from the cooling tube 4 on one end in the lamination direction X. The coolant introducing portion 421 and the coolant discharging portion 422 protrude from the resin sealing portion 7. In addition, as shown in FIG. 29, the cooling tubes 4 and the laminated component groups 11 are alternately arranged in the lamination direction X.

The semiconductor elements 2 that are arranged on both cooling surfaces of the cooling tube 4 that are on opposite sides of each other are arranged to be at least partially overlapping when viewed from the lamination direction X. According to the present embodiment, when viewed from the lamination direction X, the semiconductor elements 2 are arranged to substantially entirely overlap each other.

In addition, the metal joining materials 6 that are joined to both main surfaces of the cooling tube 4 substantially entirely overlap each other, when viewed in the lamination direction X. In a similar manner, the insulating portions 5 that are joined to both main surfaces of the cooling tube 4 by the metal joining materials 6 are arranged to substantially entirely overlap each other, when viewed from the lamination direction X. Still further, the lead frames 3 that are arranged on both main surfaces of the cooling tubes 4 by the metal joining materials 6 and the insulating portions 5 are also arranged to substantially entirely overlap each other, when viewed from the lamination direction X.

In addition, the sub-assembly 103 has a substantially linearly symmetrical shape in the lamination direction X. That is, aside from the differences regarding the semiconductor element 2 and the terminal chip 12, the configurations on one side and the other side of the cooling tube 4 are substantially similar. For example, coefficients of linear expansion of the component groups that are respectively arranged on the pair of cooling surfaces 431 and 432 of the cooling tube 4 are substantially equal. More specifically, for example, a difference in the coefficient of linear expansion between the component groups that are respectively arranged on the pair of cooling surfaces 431 and 432 of the cooling tube 4 is equal to or less than 30%, and more preferably equal to or less than 20% relative to an average value of the coefficients of linear expansion of both component groups.

Other configurations are similar to those according to the second embodiment.

According to the present embodiment, in the cooling tube 4, the semiconductor elements 2 are arranged on both cooling surfaces that are on opposite sides of each other in the lamination direction X. As a result, deformation such as warping of the cooling tube 4 is easily suppressed. That is, in the configuration in which the semiconductor element 2 is arranged on only one surface of the cooling tube 4, the components are joined to only one surface of the cooling tube 4. As a result, stress that is received from these joining portions is unbalanced. Therefore, unless rigidity of the cooling tube 4 is increased, deformation such as warping may occur in the cooling tube 4.

In addition, as a result of a configuration such as this, the semiconductor element 2 can be cooled on both main surfaces of the cooling tube 4. Therefore, a number of semiconductor elements 2 that can be cooled by a single cooling tube 4 can be increased. In addition, size reduction of the power conversion apparatus 1 in the lamination direction X can be obtained.

Furthermore, the semiconductor elements 2 that are arranged on both cooling surfaces of the cooling tube 4 that are on opposite sides of each other are arranged to be at least partially overlapping when viewed from the lamination direction X. Consequently, deformation such as warping of the cooling tube 4 can be even more easily suppressed.

In addition, the three or more cooling tubes 4, and the semiconductor elements 2 and the lead frames in the plurality of gap portions 44 are integrated by the resin sealing portion 7. As a result, components that are integrated by the resin sealing portion 7 can be increased. Consequently, improvement in durability and improvement in strength of the power conversion apparatus 1 can be obtained.

Furthermore, the resin sealing portion 7 also seals the connecting portions 42. As a result, sealing of the connecting portions 42 can be performed by the resin sealing portion 7. That is, in the connecting portions 42 that are joined, sealing is preferably performed to reliably prevent leakage of the coolant. According to the present embodiment, this sealing can also be performed by the resin sealing portion 7 that is provided for the purpose of ensuring insulation of the semiconductor element and the like. Consequently, reduction in the number of components and reduction in the number of manufacturing steps can be obtained.

Other effects are similar to those of the second embodiment.

Here, the resin sealing portion 7 is merely required to cover the semiconductor element 2, the lead frame 3, and the insulating portion 5, and be joined to the cooling tube 4. The resin sealing portion 7 is not necessarily required to be formed to cover the plurality of cooling tubes 4, as shown in FIG. 30. That is, although not shown in the drawings, the resin sealing portion 7 may cover the laminated component groups 11, while being arranged in only the gap portions 44 between adjacent cooling tubes 4.

Eighth Embodiment

Figure 31:
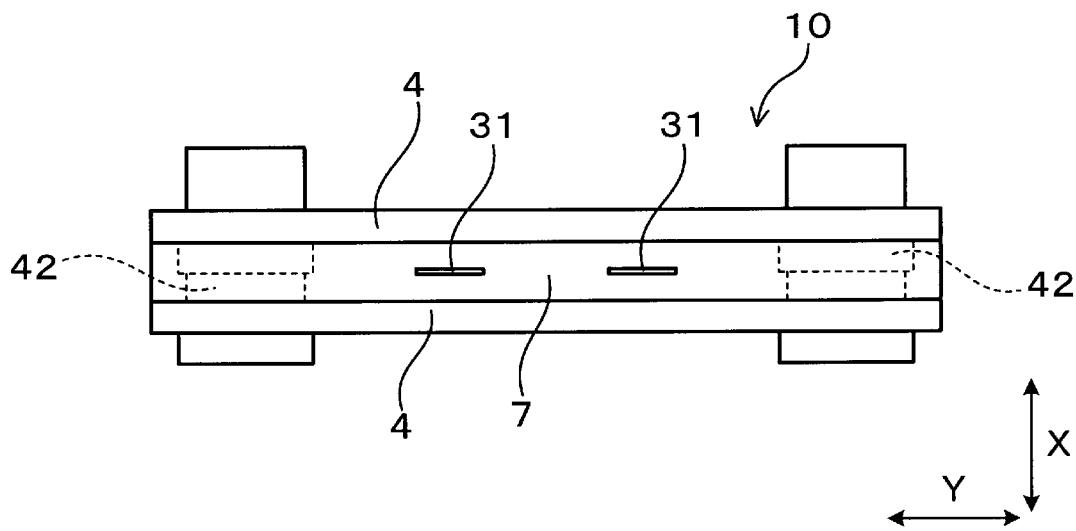
FIG. 31 is an explanatory plan view of a semiconductor cooling assembly according to an eighth embodiment.

As shown in FIG. 31, in the power conversion apparatus 1 according to an eighth embodiment, the resin sealing portion 7 is arranged to cover the connecting portions 42.

That is, the resin sealing portion 7 is formed to cover the pair of connecting portions 42 that are arranged on both sides of the laminated component group 11 in the lateral direction Y, together with the laminated component group 11. As a result, each connecting portion 42 is sealed by the resin sealing portion 7 over an overall circumference of each connecting portion 42.

Other configurations are similar to those according to the first embodiment.

According to the present embodiment, the connecting portion 42 is sealed by the resin sealing portion 7. Therefore, sealing of the connecting portions 42 can be performed by the resin sealing portion 7. That is, sealing of the connecting portions 42 that are joined can also be performed by the resin sealing portion 7 that is provided for the purpose of ensuring insulation of the semiconductor element 2 and the like. That is, in addition to ensuring insulation of the semiconductor element 2, and integrating the laminated component groups 11 and the cooling tubes 4, sealing the connecting portions 42 can also be provided as a role served by the resin sealing portion 7. Consequently, reduction in the number of components and reduction in the number of manufacturing steps can be obtained.

In addition, a mold for forming the resin sealing portion 7 can be shaped to cover an outer shape of the cooling tube 4. Therefore, a structure of the mold can be simplified. An easy-to-manufacture power conversion apparatus 1 can be obtained.

Other effects are similar to those of the first embodiment.

Ninth Embodiment

Figure 32:
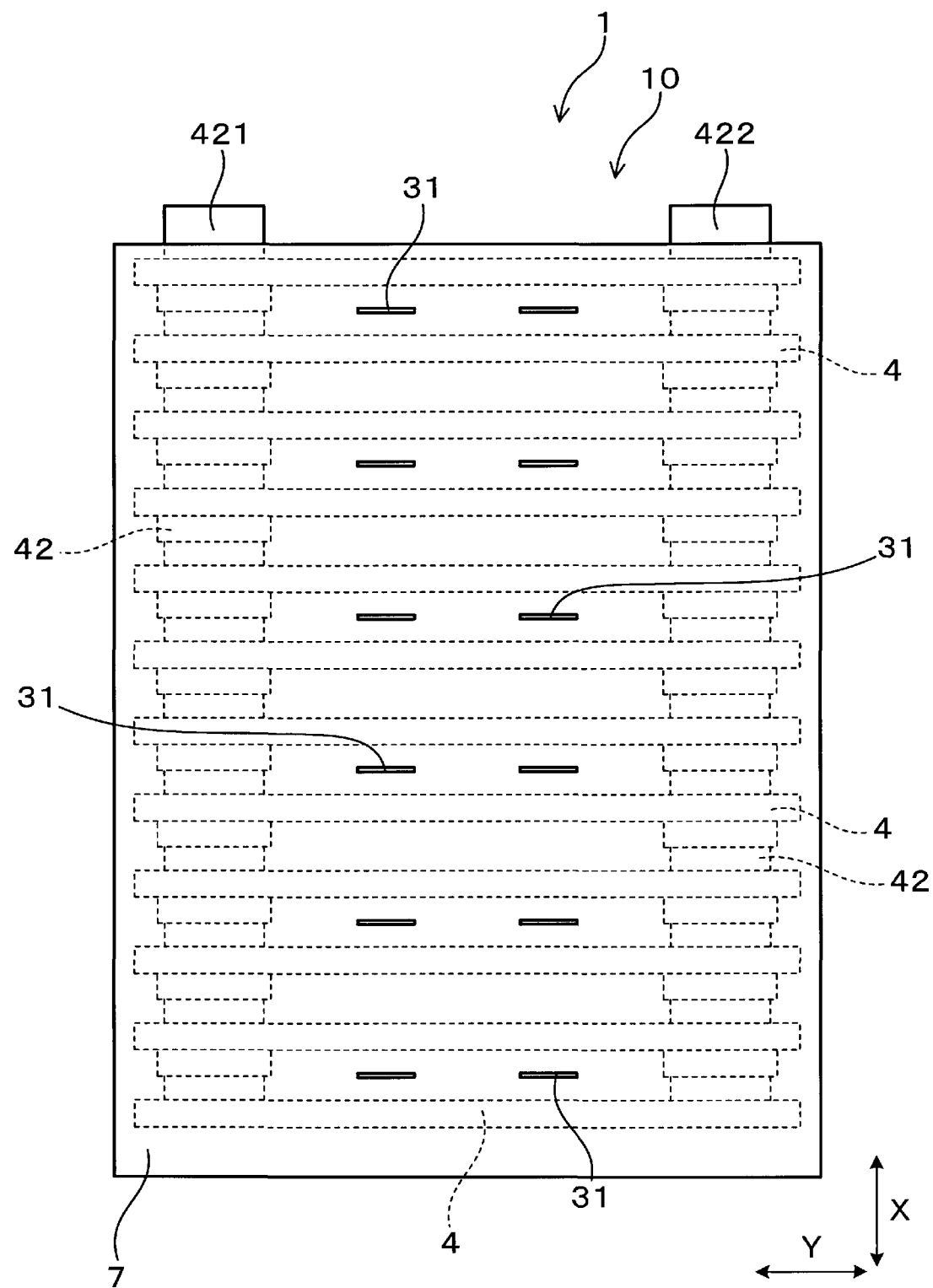
FIG. 32 is an explanatory plan view of a power conversion apparatus according to a ninth embodiment.

As shown in FIG. 32, in the power conversion apparatus 1 according to a ninth embodiment, the resin sealing portion 7 substantially entirely covers a laminated body in which numerous cooling tubes 4 and numerous laminated component groups 11 are laminated.

A structure of the laminated body itself that is composed of the cooling tubes 4 and the laminated component groups 11, excluding the resin sealing portion 7, is similar to the structure shown in FIG. 3, according to the first embodiment. In addition, the resin sealing portion 7 is formed to cover all of the cooling tubes 4 and all of the laminated component groups 11 in the laminated body. In this case, a single semiconductor cooling assembly 10 is configured by all of the cooling tubes 4 and all of the laminated component groups 11 in the laminated body and the resin sealing portion 7. Here, the power terminals 31, the coolant introducing portion 421, and the coolant discharging portion 422 protrude from the resin sealing portion 7.

Other configurations are similar to those according to the first embodiment.

According to the present embodiment, the mold for forming the resin sealing portion 7 can be shaped to cover the outer shape of the laminated body. Therefore, the structure of the mold can be simplified. A more easy-to-manufacture power conversion apparatus 1 can be obtained.

Other effects are similar to those of the present embodiment.

Tenth Embodiment

Figure 33:
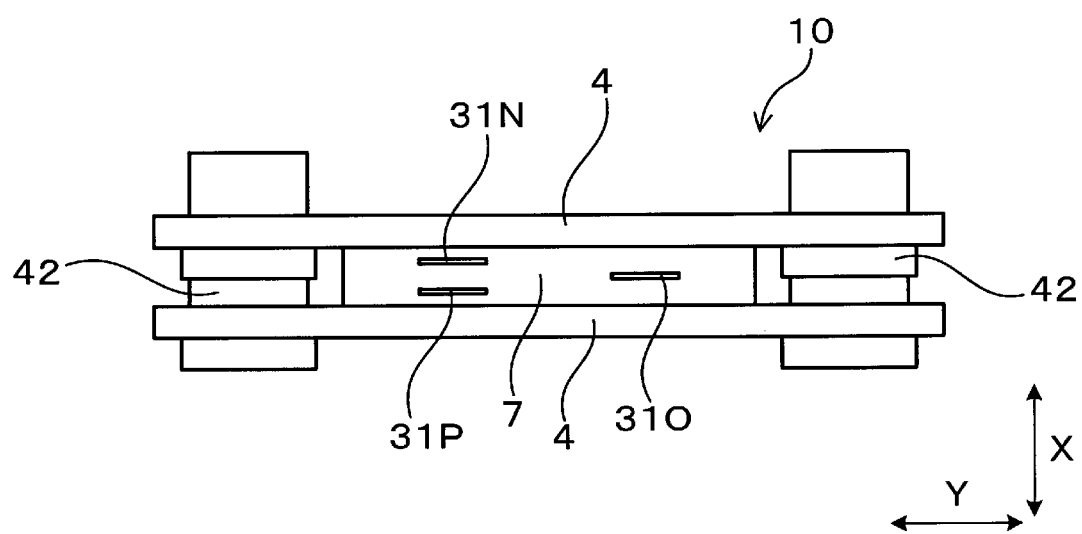
FIG. 33 is an explanatory cross-section view of a semiconductor cooling assembly according to a tenth embodiment.

As shown in FIG. 33, in the power conversion apparatus 1 according to a tenth embodiment, the positive power terminal 31P and the negative power terminal 31N are arranged such that their main surfaces oppose each other.

The positive power terminal 31P and the negative power terminal 31N are each formed into a plate shape. The main surface of the positive power terminal 31P and the main surface of the negative power terminal 31N both face the lamination direction X. In the lamination direction X, the main surface of the positive power terminal 31P and the main surface of the negative power terminal 31N oppose each other. That is, when viewed from the lamination direction X, the positive power terminal 31P and the negative power terminal 31N are arranged to overlap. Here, the output power terminal 31O is arranged in a position away from the positive power terminal 31P and the negative power terminal 31N in the lateral direction Y.

Other configurations are similar to those according to the second embodiment.

According to the present embodiment, the positive power terminal 31P and the negative power terminal 31N through which currents flow in opposite directions of each other are arranged opposite to each other. Consequently, inductance can be effectively reduced.

Other effects are similar to those of the second embodiment.

Eleventh Embodiment

Figure 34:
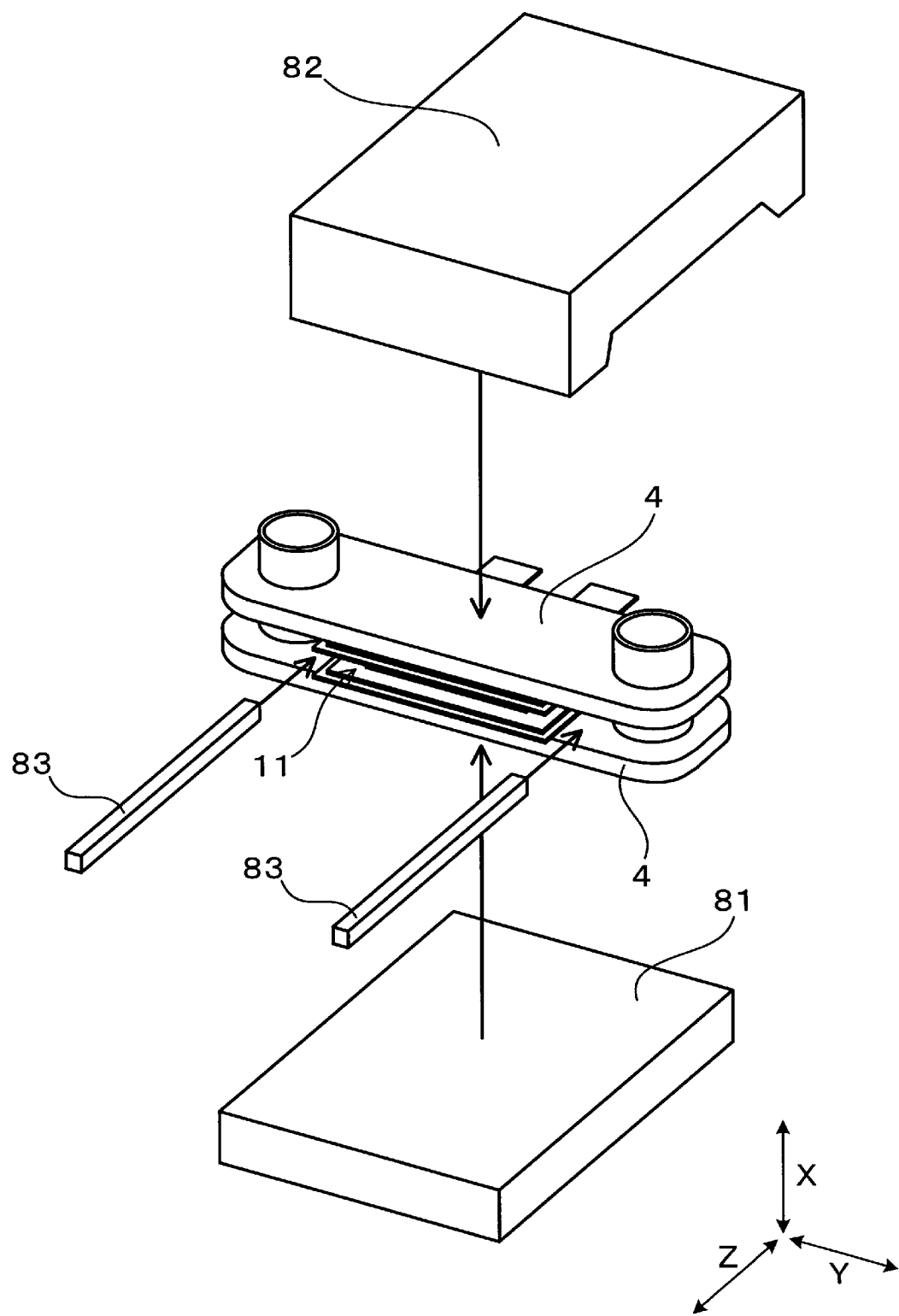
FIG. 34 is an explanatory perspective view of a forming method for a resin sealing portion according to an eleventh embodiment.
Figure 35:
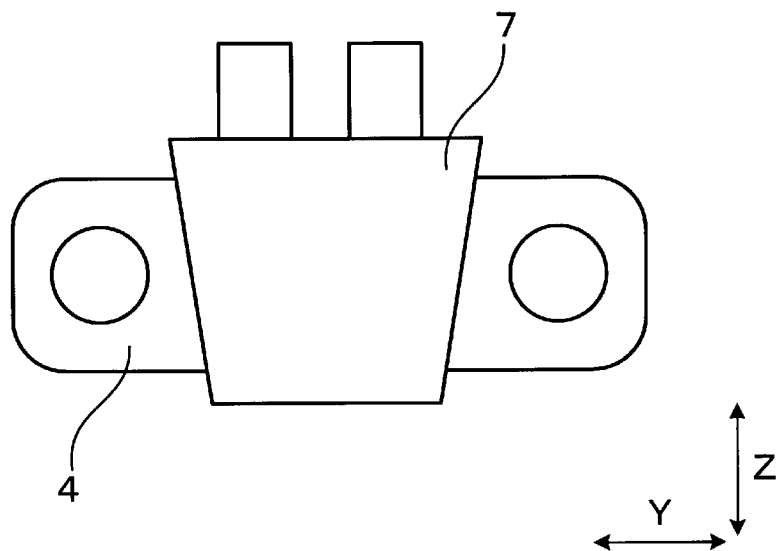
FIG. 35 is an explanatory plan view of a shape of the resin sealing portion according to the eleventh embodiment.
Figure 36:
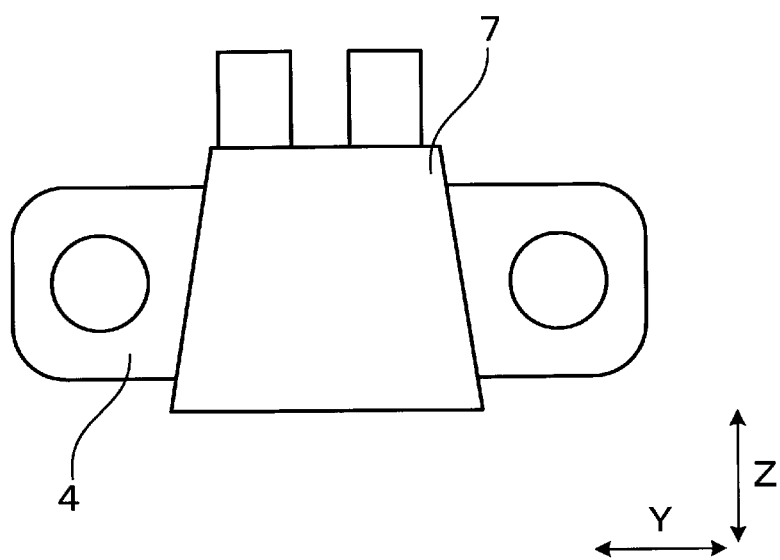
FIG. 36 is an explanatory plan view of another shape of the resin sealing portion according to the eleventh embodiment.

As shown in FIG. 34 to FIG. 36, according to a eleventh embodiment, an aspect of a method for resin-sealing the laminated component group 11 will be described.

That is, the present embodiment is an aspect of a formation method for the resin sealing portion 7 to achieve a state in FIG. 12 from a state in FIG. 11, according to the above-described first embodiment.

First, as shown in FIG. 34, the pair of cooling tubes 4, between which the laminated component group 11 is arranged, are sandwiched by a lower mold 81 and an upper mold 82 in the lamination direction X. At this time, slide molds 83 that have a substantially prism-like shape are arranged on both sides of the laminated component group 11 in the lateral direction Y, between the pair of cooling tubes 4. In this state, resin is poured into a cavity that is surrounded by the lower mold 81, the upper mold 82, and the pair of slide molds 83. Then, after the resin is hardened, the lower mold 81, the upper mold 82, and the pair of slide molds 83 are removed. As a result, the laminated component group 11 is sealed by the resin sealing portion 7 between the pair of cooling tubes 4. That is, as a result, the semiconductor cooling assembly 10 such as that shown in FIG. 12 is obtained.

As described above, when the pair of slide molds 83 are used, the molds are slid in one vertical direction Z. Therefore, as shown in FIG. 35 or FIG. 36, side surfaces of the resin sealing portion 7 that is obtained are formed into a tapered shape. Here, FIG. 35 shows the shape of the resin sealing portion 7 in which the slide molds 83 is inserted and removed from a side opposite the power terminal 31. Meanwhile, FIG. 36 shows the shape of the resin sealing portion 7 in which the slide molds 83 are inserted and removed from the power terminal 31 side. In FIG. 35 and FIG. 36, the tapered shape is shown in a slightly emphasized manner. A tilt of the taper can be reduced from that shown in the drawings. This similarly applies to FIG. 38, described hereafter.

According to the present embodiment, the resin sealing portion 7 can be favorably formed.

Twelfth Embodiment

Figure 37:
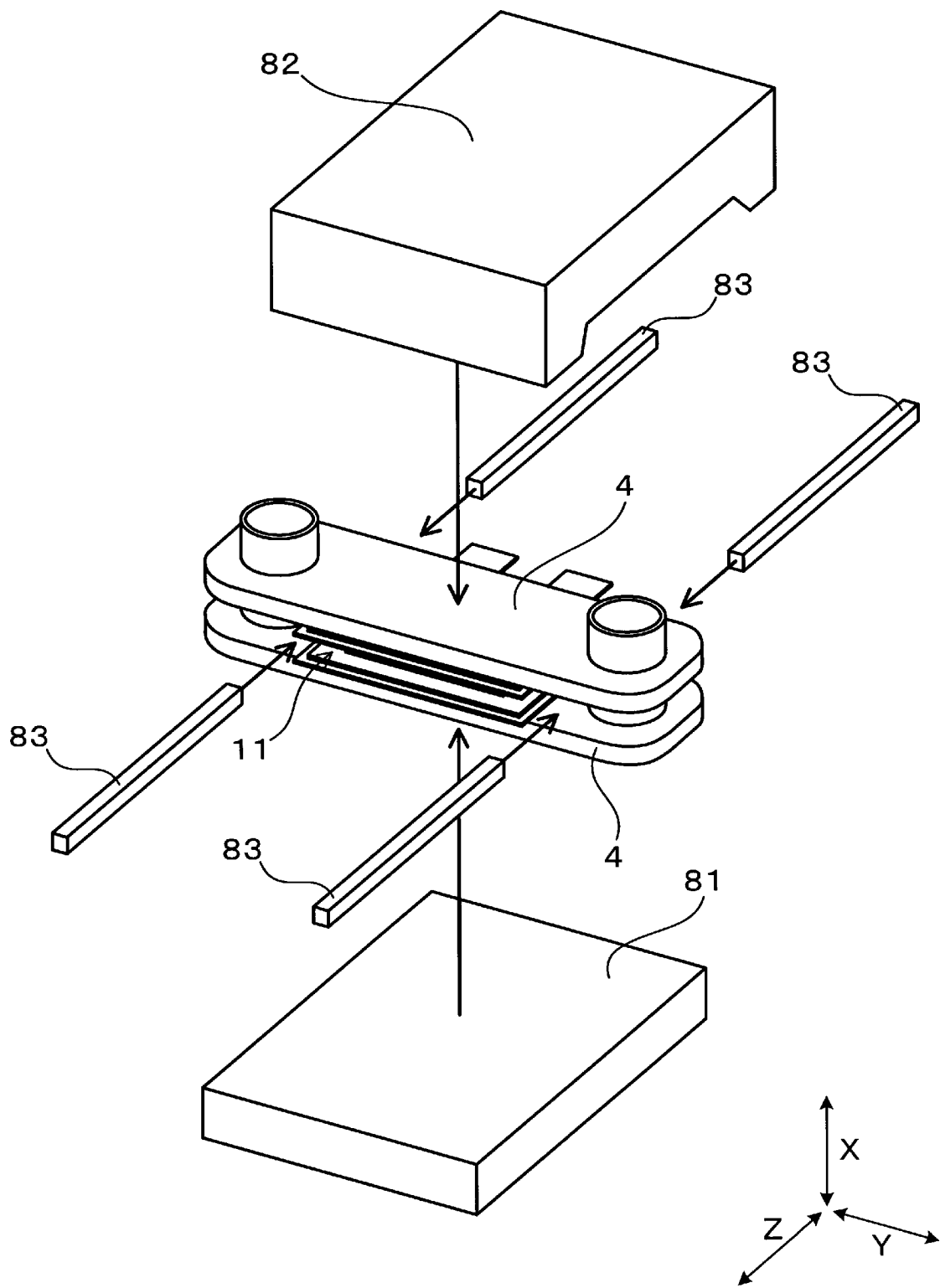
FIG. 37 is an explanatory perspective view of a forming method for a resin sealing portion according to a twelfth embodiment.
Figure 38:
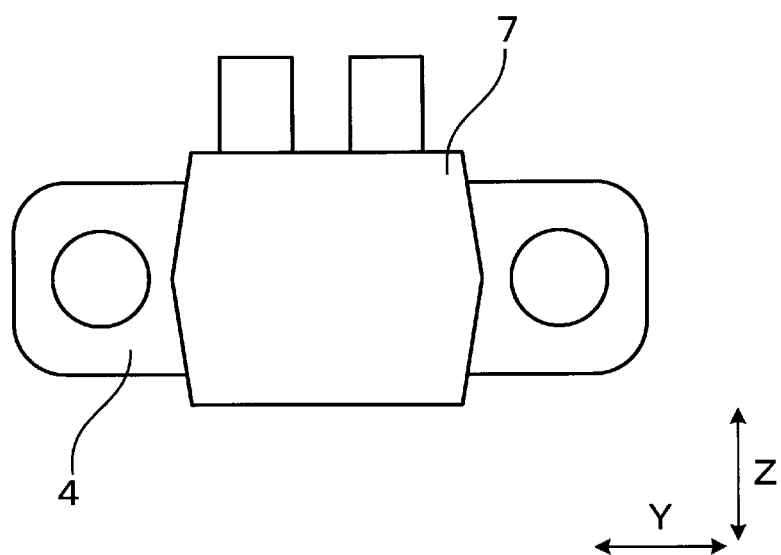
FIG. 38 is an explanatory plan view of a shape of the resin sealing portion according to the twelfth embodiment.

As shown in FIG. 37 and FIG. 38, according to a twelfth embodiment, another aspect of the method for resin-sealing the laminated component group 11 will be described.

According to the present embodiment, four slide molds 83 are used. That is, two slide molds 83 are inserted and removed from the power terminal 31 side in the vertical direction Z. The other two slide molds 83 are inserted and removed from the power terminal 31 side in the vertical direction Z. In this case, as shown in FIG. 38, the resin sealing portion 7 that is obtained has a tapered shape in which the width of the resin sealing portion 7 in the lateral direction Y increases towards a center portion in the vertical direction Z.

Other configurations are similar to those according to the eleventh embodiment.

The present disclosure is not limited in any way to the above-described embodiments. Various aspects are possible without departing from the spirit of the present disclosure.

The present disclosure is described based on the embodiments. However, it is understood that the present disclosure is not limited to the embodiments and constructions. The present disclosure is intended to cover various modification examples and modifications within the range of equivalency. In addition, various combinations and configurations, and further, other combinations and configurations including more, less, or only a single element thereof are also within the spirit and scope of the present disclosure.

What is claimed is:

1. A power conversion apparatus comprising:
a semiconductor element;
a lead frame that is electrically connected to the semiconductor element;
a flow-passage formation body that forms a coolant passage in which a coolant flows;
an insulating portion that is arranged between the lead frame and the flow-passage formation body to provide insulation between the lead frame and the flow-passage formation body;
a metal joining material that joins the insulating portion and the flow-passage formation body; and
a resin sealing portion that seals the semiconductor element and the lead frame, wherein
the semiconductor element and the lead frame are integrated with the flow-passage formation body to form a semiconductor sealing assembly by the resin sealing portion,
the flow-passage formation body includes a plurality of tube-shaped cooling tubes that are arranged to be laminated in a direction that is orthogonal to a flow direction of the coolant,
the semiconductor cooling assembly includes at least a pair of cooling tubes that are arranged opposite to each other in a lamination direction, and the resin sealing portion, the semiconductor element, and the lead frame that are arranged between the pair of cooling tubes and integrated with the pair of cooling tubes,
the plurality of cooling tubes comprises three or more cooling tubes that are arranged to be laminated in the lamination direction,
a plurality of gap portions between the cooling tubes that are adjacent to each other in the lamination direction are provided in a plurality of positions in the lamination direction,
the semiconductor elements are arranged together with the lead frames in the gap portions in the plurality of positions, and
the three or more cooling tubes are integrated with the semiconductor elements and the lead frames in the gap portions by the resin sealing portion.

2. The power conversion apparatus according to claim 1, wherein:
the semiconductor cooling assembly includes a plurality of the semiconductor elements that are arranged side-by-side in a direction that is orthogonal to the lamination direction, between the pair of cooling tubes.

3. The power conversion apparatus according to claim 2, wherein:
at least two of the plurality of semiconductor elements in the semiconductor cooling assembly are an upper-arm semiconductor element and a lower-arm semiconductor element that are connected to each other in series.

4. The power conversion apparatus according to claim 3, wherein:
the semiconductor cooling assembly includes
a positive power terminal that is electrically connected to the upper-arm semiconductor element, and
a negative power terminal that is electrically connected to the lower-arm semiconductor element,
the positive power terminal and the negative power terminal being configured to protrude from the resin sealing portion in a same direction as each other and arranged to be adjacent to each other.

5. The power conversion apparatus according to claim 4, wherein:
the positive power terminal and the negative power terminal are each formed into a plate shape, and the positive power terminal and the negative power terminal are arranged such that respective main surfaces oppose each other.

6. The power conversion apparatus according to claim 1, wherein:
the flow-passage formation body includes a plurality of tube-shaped cooling tubes that are arranged to be laminated in a direction that is orthogonal to a flow direction of the coolant; and
in at least one of the plurality of cooling tubes, the semiconductor elements are arranged on both cooling surfaces that are on opposite sides to each other in the lamination direction.

7. The power conversion apparatus according to claim 6, wherein:
the semiconductor elements that are arranged on both cooling surfaces of the cooling tube that are on opposite sides of each other are arranged to be at least partially overlapping when viewed from the lamination direction.

8. The power conversion apparatus according to claim 1, wherein:
the semiconductor cooling assembly includes a pair of cooling tubes that are arranged opposite to each other in the lamination direction; and in the pair of cooling tubes, the semiconductor element is arranged on only one surface in the lamination direction.

9. The power conversion apparatus according to claim 1, wherein:
the insulating portion includes a ceramic substrate and metal layers that are respectively formed on both main surfaces of the ceramic substrate.

10. The power conversion apparatus according to claim 9, wherein:
the metal layers are respectively formed on both main surfaces of the ceramic substrate in sections that exclude peripheral edge portions.

11. The power conversion apparatus according to claim 1, wherein:
in the flow-passage formation body, the coolant flow passage is formed in a position that opposes a section to which the metal joining material is joined.

12. A power conversion apparatus comprising:
a semiconductor element;
a lead frame that is electrically connected to the semiconductor element;
a flow-passage formation body that forms a coolant passage in which a coolant flows;
an insulating portion that is arranged between the lead frame and the flow-passage formation body to provide insulation between the lead frame and the flow-passage formation body;
a metal joining material that joins the insulating portion and the flow-passage formation body; and
a resin sealing portion that seals the semiconductor element and the lead frame, wherein
the semiconductor element and the lead frame are integrated with the flow-passage formation body to form a semiconductor sealing assembly by the resin sealing portion,
the flow-passage formation body includes a plurality of tube-shaped cooling tubes that are arranged to be laminated in a direction that is orthogonal to a flow direction of the coolant,
the semiconductor cooling assembly includes at least a pair of cooling tubes that are arranged opposite to each other in a lamination direction, and the resin sealing portion, the semiconductor element, and the lead frame that are arranged between the pair of cooling tubes and integrated with the pair of cooling tubes,
the cooling tubes that are adjacent to each other in the lamination direction are connected by a connecting portion that communicates between respective coolant flow passages, and
the resin sealing portion also seals the connecting portion.

13. The power conversion apparatus according to claim 12, wherein:
the plurality of cooling tubes comprises three or more cooling tubes that are arranged to be laminated in the lamination direction;
a plurality of gap portions between the cooling tubes that are adjacent to each other in the lamination direction are provided in a plurality of positions in the lamination direction;
the semiconductor elements are arranged together with the lead frames in the gap portions in the plurality of positions; and
the three or more cooling tubes are integrated with the semiconductor elements and the lead frames in the gap portions by the resin sealing portion.

14. The power conversion apparatus according to claim 12, wherein:
the semiconductor cooling assembly includes a plurality of the semiconductor elements that are arranged side-by-side in a direction that is orthogonal to the lamination direction, between the pair of cooling tubes.

15. The power conversion apparatus according to claim 12, wherein:
the flow-passage formation body includes a plurality of tube-shaped cooling tubes that are arranged to be laminated in a direction that is orthogonal to a flow direction of the coolant; and
in at least one of the plurality of cooling tubes, the semiconductor elements are arranged on both cooling surfaces that are on opposite sides to each other in the lamination direction.

16. The power conversion apparatus according to claim 12, wherein:
the semiconductor cooling assembly includes a pair of cooling tubes that are arranged opposite to each other in the lamination direction; and
in the pair of cooling tubes, the semiconductor element is arranged on only one surface in the lamination direction.

17. The power conversion apparatus according to claim 12, wherein:
the insulating portion includes a ceramic substrate and metal layers that are respectively formed on both main surfaces of the ceramic substrate.

18. The power conversion apparatus according to claim 12, wherein:
in the flow-passage formation body, the coolant flow passage is formed in a position that opposes a section to which the metal joining material is joined.

* * * * *